United States Patent
Pappu et al.

(10) Patent No.: US 11,042,315 B2
(45) Date of Patent: Jun. 22, 2021

(54) DYNAMICALLY PROGRAMMABLE MEMORY TEST TRAFFIC ROUTER

(71) Applicant: Intel Corporation, Santa Clara, CA (US)

(72) Inventors: Lakshminarayana Pappu, Folsom, CA (US); Christopher E. Cox, Placerville, CA (US); Navneet Dour, El Dorado Hills, CA (US); Asaf Rubinstein, Tel-Aviv (IL); Israel Diamand, Aderet (IL)

(73) Assignee: Intel Corporation, Santa Clara, CA (US)

( * ) Notice: Subject to any disclaimer, the term of this patent is extended or adjusted under 35 U.S.C. 154(b) by 90 days.

(21) Appl. No.: 15/940,499

(22) Filed: Mar. 29, 2018

(65) Prior Publication Data

US 2019/0042131 A1 Feb. 7, 2019

(51) Int. Cl.
| | |
|---|---|
| *G06F 3/06* | (2006.01) |
| *G06F 12/0888* | (2016.01) |
| *G06F 13/16* | (2006.01) |
| *G06F 13/42* | (2006.01) |

(52) U.S. Cl.
CPC .......... *G06F 3/0635* (2013.01); *G06F 3/0616* (2013.01); *G06F 3/0685* (2013.01); *G06F 12/0888* (2013.01); *G06F 13/1668* (2013.01); *G06F 13/4282* (2013.01); *G06F 2212/60* (2013.01); *G06F 2213/0026* (2013.01)

(58) Field of Classification Search
CPC ............. G06F 13/1668; G06F 13/4282; G06F 3/0685; G06F 3/0616; G06F 12/0888; G06F 2212/60; G06F 2212/0026
See application file for complete search history.

(56) References Cited

U.S. PATENT DOCUMENTS

| | | | | |
|---|---|---|---|---|
| 6,101,578 A | * | 8/2000 | Patwardhan | G06F 9/3802 711/125 |
| 7,536,509 B2 | * | 5/2009 | Campanale | G06F 12/0802 711/118 |
| 9,037,643 B2 | * | 5/2015 | Kazerani | G06F 16/9574 709/203 |
| 9,934,152 B1 | * | 4/2018 | Bryant | G06F 12/0895 |
| 2003/0028728 A1 | * | 2/2003 | Ito | G06F 12/0815 711/118 |

(Continued)

OTHER PUBLICATIONS

B. Mohammad, Embedded Memory Design for Multi-Core and Systems on Chip, Analog Circuits and Signal Processing 116, 2014, pp. 13-29, Springer Science & Business Media, New York.

*Primary Examiner* — Ramon A. Mercado
(74) *Attorney, Agent, or Firm* — Compass IP Law PC

(57) ABSTRACT

In a computer system, a multilevel memory includes a near memory device and a far memory device, which are byte addressable. The multilevel memory includes a controller that receives a data request including original tag information. The controller includes routing hardware to selectively provide alternate tag information for the data request to cause a cache hit or a cache miss to selectively direct the request to the near memory device or to the far memory device, respectively. The controller can include selection circuitry to select between the original tag information and the alternate tag information to control where the data request is sent.

22 Claims, 10 Drawing Sheets

(56) References Cited

U.S. PATENT DOCUMENTS

| | | | |
|---|---|---|---|
| 2007/0005891 A1* | 1/2007 | Campbell | G06F 12/0893 |
| | | | 711/118 |
| 2010/0180154 A1* | 7/2010 | Bellows | G11C 29/20 |
| | | | 714/30 |
| 2015/0278096 A1 | 10/2015 | Rolan et al. | |
| 2016/0179666 A1* | 6/2016 | Greenspan | G06F 12/082 |
| | | | 711/128 |
| 2018/0018171 A1* | 1/2018 | Amidi | G06F 13/00 |
| 2018/0032429 A1 | 2/2018 | Liu et al. | |
| 2019/0004952 A1 | 1/2019 | Wang et al. | |
| 2019/0042131 A1* | 2/2019 | Pappu | G06F 3/0635 |

* cited by examiner

DYNAMICALLY PROGRAMMABLE MEMORY TEST TRAFFIC ROUTER

FIELD

Descriptions are generally related to memory subsystems, and more particular descriptions are related to memory subsystems with multiple levels of memory.

BACKGROUND

Computing systems typically incorporate multiple stand-alone components onto a common platform. For example, processor components and memory components can be incorporated into a computer motherboard. All manufacturing processes are susceptible to errors, and the various manufacturers test for errors. However, original equipment manufacturers (OEMs) who incorporate the components on the boards or hardware platforms may experience failures that are due to component failure rather than board failure.

Memory has been a significant component for integration into computing system hardware platforms. As memory densities increase, the total number of errors tends to increase. But with increasing memory size, the testing for memory becomes more complicated. With the introduction of two-level memory systems with multiple types of memory integrated together as system memory, the tag arrays that identify contents of memory have likewise expanded. The need to fill tag arrays and caches to provide a proper test for the memory subsystem can be very time consuming and expensive. To provide a proper test of hit/miss scenarios and loading of the memory system, traditional testing writes a significant amount of data into the devices and has to generate a significant number of instructions to test it.

BRIEF DESCRIPTION OF THE DRAWINGS

The following description includes discussion of figures having illustrations given by way of example of an implementation. The drawings should be understood by way of example, and not by way of limitation. As used herein, references to one or more examples are to be understood as describing a particular feature, structure, or characteristic included in at least one implementation of the invention. Phrases such as "in one example" or "in an alternative example" appearing herein provide examples of implementations of the invention, and do not necessarily all refer to the same implementation. However, they are also not necessarily mutually exclusive.

Figure 1:
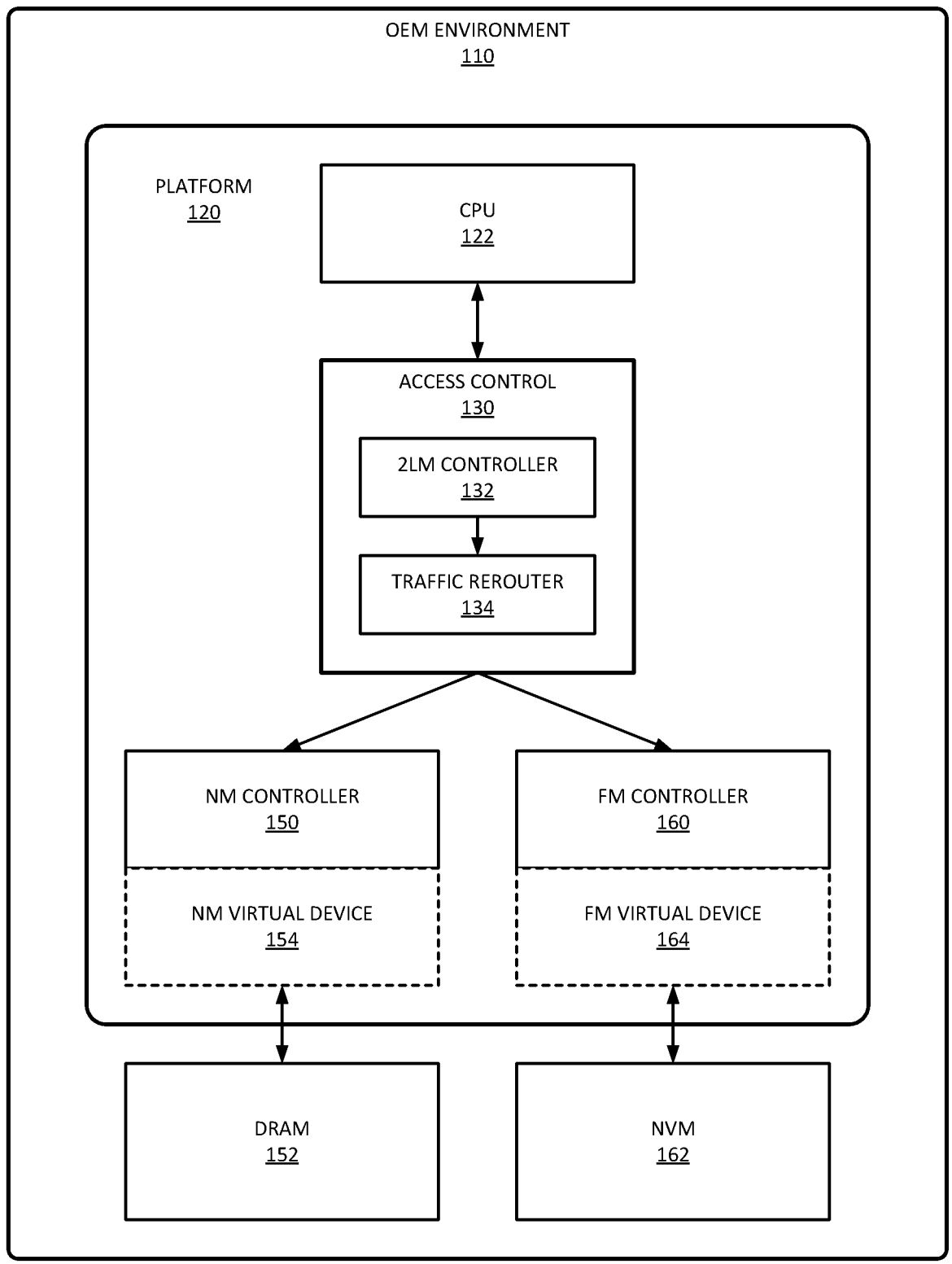
FIG. 1 is a block diagram of an example of a system in which a multilevel memory controller includes a dynamically programmable traffic router.

Descriptions of certain details and implementations follow, including non-limiting descriptions of the figures, which may depict some or all examples, and well as other potential implementations.

DETAILED DESCRIPTION

As described herein, a multilevel memory such as a two-level memory (2LM) includes a near memory device and a far memory device, which are byte addressable. The computer system platform can include a controller to interface with the near memory device and the far memory device, including determining how to route data based on tag array information. The controller can include routing hardware that selectively provides alternate tag information or a modification of the tag information for a data request. The routing hardware enables the system to generate cache hits or cache misses dynamically, regardless of the address associated with the memory access request.

Thus, for example, the system can generate a cache hit for a memory access request to an address that is actually not stored in memory. Alternatively, for example, the system can generate a cache miss for data that is stored in memory. As such, the controller routing hardware can selectively provide alternate tag information for the data request to cause a cache hit or a cache miss to selectively direct the request to near memory or to far memory. The controller can include selection circuitry to select between the original tag information and the alternate tag information to control where the data request is sent.

Such hardware can enable the testing of a memory subsystem without needing to fill a tag array or a cache. The system has programmable re-routing logic incorporated into the multilevel memory system itself, such as an alternate data path for memory requests. Instead of needing to fill the tag array and cache to enable cache hit and cache miss scenarios, the can create artificial hit/miss scenarios to direct the traffic to either the near memory (NM) subsystem or far memory (FM) subsystem, or to specified ways in the memory configuration. The ability to provide artificial scenarios can reduce testing time by up to 90%.

It will be understood that near memory and far memory do not necessarily refer to distance. Rather, the distinction between near memory and far memory can be average access time. System memory is typically an order of magnitude slower than on-board cache on the processor or on the CPU (central processing unit) SOC (system on a chip). System memory, in turn, is typically multiple order of magnitude faster than nonvolatile, long-term storage. System memory is traditionally implemented with volatile dynamic random access memory (DRAM) technology. Volatile memory refers to memory whose state is indeterminate if power is interrupted, and thus cannot guarantee data integrity after an interruption of power. Nonvolatile memory maintains state even if power is interrupted. Traditional nonvolatile memory for storage is block access, while DRAM is byte-addressable. Emerging memory technologies provide byte-addressable nonvolatile memory that has access speeds comparable to DRAM, while still having slower average access. Such memory technologies can be incorporated into a memory subsystem with traditional volatile memory to have multiple levels of access speed. Near memory refers to the memory with faster access time, and far memory refers to the memory with slower access time. For example, 2LM systems can include DRAM as NM, and nonvolatile three-dimensional crosspoint (3DXP) as FM.

A multilevel memory controller can include hardware to selectively direct traffic in response to a memory access command. The controller can include a traditional data pathway to enable the traditional operation of the controller to direct traffic in accordance with the tag information for the memory access request. The controller can also include the hardware to enable an alternate pathway to selectively modify the request to a desired memory location with near memory or far memory. In one example, the system can be selectively enabled to utilize the hardware, such as in a test mode, to provide the capability to re-route traffic instead of routing it in accordance with its original tag information. The re-routing can provide alternate tag information to direct the traffic to a location desired for the testing.

FIG. 1 is a block diagram of an example of a system in which a multilevel memory controller includes a dynamically programmable traffic router. OEM (original equipment manufacturer) environment 110 represents a system in which one or more computer platform components can be placed. In one example, environment 110 represents the environment of a computing system that an OEM can manufacture. In one example, environment 110 represents a debug environment or a test setup where components can be tested for errors. It will be understood that a computer system can include more components than what are illustrated in FIG. 1, and environment 110 can include additional components to what is illustrated.

Platform 120 represents a computing platform, and in one example can be a device to be tested by the OEM. In one example, platform 120 represents an SOC for a computing system. In one example, platform 120 includes CPU 122, access control 130, near memory (NM) controller 150, and far memory (FM) controller 160. It will be understood that platform 120 can include other components that are not illustrated in FIG. 1. The components illustrated represent one or more logic or circuit components to provide access to CPU 122 to memory resources.

In one example, platform 120 can represent a test environment for testing various components. It will be understood that components can be tested at different stages of the manufacturing process. Thus, for example, the components can be tested as part of a sort test or sort debugging, where a bare silicon or unpackaged die can be tested for functionality. An additional testing can occur as part of class testing or class debug, where a device is tested in-package. In-package refers to a die that is placed in a package that includes a pin or ball interface, and a packaging body around the die.

CPU 122 represents a computing or processing resources for platform 120, and can be understood generally as the component to execute an operating system that will manage a software environment to control the operation of platform 120. CPU 122 can represent any type of processor, which can include a multicore processor. Access control 130 represents hardware elements within platform 120 to control the routing of traffic from CPU 122 to memory resources. In one example, access control 130 is integrated onto a common die with CPU 122.

In one example, access control 130 includes 2LM controller 132 or other multilevel memory controller. 2LM controller 132 can determine where to send a data request. In operation, whether in a final device implementation or in a test environment, when CPU 122 executes an operation involving data or code not stored in cache resources on CPU 122 (the cache resources are not specifically shown), the last level cache will generate a request for the data from a next level of memory, which is system memory.

In a 2LM system, the system memory can include DRAM 152 and NVM (nonvolatile memory) 162. DRAM 152 represents a memory with average access times faster than that of NVM 162; thus, DRAM 152 can be considered near memory, and NVM 162 can be considered far memory. NVM 162 can be or include 3DXP memory, phase change memory or other resistive-based memory (stores state based on a resistive state of a memory cell), or a charge-based memory (stores state based on a charge of a memory cell). An additional level of memory can be included with an additional associated controller, and additional control logic within 2LM to determine how to utilize the memory resources, such as with scheduling and caching. In traditional testing, physical devices DRAM 152 and NVM 162 would need to be included to perform system testing, and would need to have data loaded into the devices for proper testing.

Access control 130 of platform 120 includes traffic re-router 134, which represents hardware to redirect data requests. In one example, traffic re-router 134 is part of 2LM controller 132. In one example, traffic re-router 134 is parallel to standard data path of 2LM controller 132. Traffic re-router 134 enables 2LM controller 132 to direct traffic selectively to DRAM 152 or to NVM 162. Thus, in one example, access control 130 can overwrite the native traffic direction in 2LM controller 132 for debug and early class test.

Platform 120 includes NM controller 150 to interface with DRAM 152 or near memory media. Platform 120 includes FM controller 160 to interface with NVM 162 or the far memory media. NM controller 150 includes hardware such as connectors and transceivers to interface physically and electrically with DRAM 152. Similarly, FM controller 160 includes hardware such as connectors and transceivers to interface physically and electrically with NVM 162. The interconnections enable the exchange of data between the controller and its respective memory media. The interconnections can be or include, for example, a DDR (double data rate) interface to DRAM 152, or a PCIe (peripheral connection interface express) to NVM 162, or others, or a combination of these.

In one example, platform 120 includes NM virtual device 154. In one example, platform 120 includes FM virtual device 164. In one example, platform 120 includes both NM virtual device 154 and FM virtual device 164. The virtual devices can be implemented by control logic or hardware that is separate and parallel to what is used to interface with the memory media. For example, NM virtual device 154 can be implemented as a circuit that provides a parallel data path to a data path that enables NM controller 150 to interface with DRAM 152. FM virtual device 164 can be similar with respect to FM controller 160 and NVM 162. In one example, NM virtual device 154 is part of NM controller 150. In one example, FM virtual device 164 is part of FM controller 160.

The virtual devices enable the testing of components within platform 120 without having to actually access physical devices DRAM 152 or NVM 162, or both. The virtual devices enable the decoding of incoming traffic (e.g., data streams) and responding to the traffic without sending the traffic to the physical intended target. More details are provided below. It will be understood that as a practical matter, it would make sense to include virtual devices on both the near memory path as well as the far memory path. However, it is conceivable to include a virtual device on either the near memory path or on the far memory path, but not both. Some gain may be had in having one of the virtual devices as opposed to having no virtual devices. More benefit can be achieved with having both virtual devices.

Traffic re-router 134 can be considered a local functional testing and debug (LOFT) component. The testing and debug can refer to the ability to provide functional operation in a test scenario. The LOFT hardware can be considered local when embedded (e.g., integrated or incorporated) into the platform itself. The hardware provides additional hardware/logic, which can be used in selected situations for redirecting traffic. In one example, an OEM can generate a test with test equipment or code to execute on the CPU. The test can be configured to direct traffic to either NM controller 150 or to FM controller 160. The ability to selectively direct traffic enables an OEM to isolate problems associated with either near memory or far memory. In one example, traffic re-router 134 can be configured to provide fine granularity of traffic routing control. For example, as opposed to simply directing traffic to NM or FM, traffic re-router 134 could direct traffic to particular ways or sets or channels, or a combination, in a given memory configuration.

An implementation of platform 120 can provide the ability to perform debug and test of memory pathways in sort and class sockets. Traditionally, sort and class sockets do not include memory modules (e.g., dual inline memory modules (DIMMs)) or far memory controllers. NM virtual device 154 and FM virtual device 164 can provide the ability to test the exchange of traffic with the memory while in such sockets. The testing can provide the ability to detect platform level interconnect failures. For example, OEM environment 110 can provide a test to detect and isolate platform level memory interconnect failures using directed transactions enabled by the hardware components of access control 130, and the virtual devices (e.g., NM virtual device 154 or FM virtual device 164).

In one example, OEM environment 110 includes a BIOS (basic input/output system) or other control logic that can execute a debug or test operation. In one example, the BIOS or control logic can be within platform 120. Using BIOS as an example with the understanding that other control logic could alternatively be used, the BIOS can utilize sideband or tap logic to program debug capability. Such programming can utilize registers on platform 120 (not specifically shown). The registers can be associated with the memory or with the CPU or both. In one example, the registers used for programming can be categorized as read only access from the perspective of the operating environment, which can allow a test system to program the registers, which can then only be read by the components of platform 120.

In one example, traffic re-router 134 enables in-field debugging of a computing platform. In one example, OEM environment 110 provides the OEM a secured mode to test the logic manufactured by the OEM, and then identify a root cause of a failure—whether the problem is with a memory controller, or with a memory device itself. Additionally, testing teams within semiconductor companies can apply the capabilities of platform 120 to perform class, sort, and platform validation to screen out defective parts.

In one example, the operation of platform 120 for test can proceed as follows. OEM environment 110 can provide a secure environment in which to execute a test, such as by requiring a secure initiation of the test. CPU 122 can generate test traffic, such as by executing test code from BIOS or another test source. In one example, 2LM controller 132 receives a request from CPU 122 and determines from tag information associated with the request whether the requested address is associated with data stored in NM or FM. Depending on the test, the test can also send configuration information to traffic re-router 134 to direct the traffic to a desired location, if the desired location is different from the native address information indicated by the tag information. Thus, traffic re-router 134 can generate a cache hit, a cache miss, a cache eviction, or other operation.

In one example, the test configures platform 120 to provide all traffic to DRAM 152, and can thus configure the system as a 1LM system even though it includes hardware for a 2LM system. The configuration of the system as a 1LM system can include configuration of traffic re-router 134 to direct all traffic to DRAM 152. In one example, the system can configure traffic re-router 134 to send all traffic to NVM 162. Thus, the system can essentially be a 1LM system with slower system memory. The system can also configure traffic re-router 134 to treat the system as a 2LM system, and direct traffic to both DRAM 152 and to NVM 162. Thus, platform 120 can test the components of platform 120 without having to fill the memories (DRAM 152 and NVM 162) to perform the testing.

Figure 2:
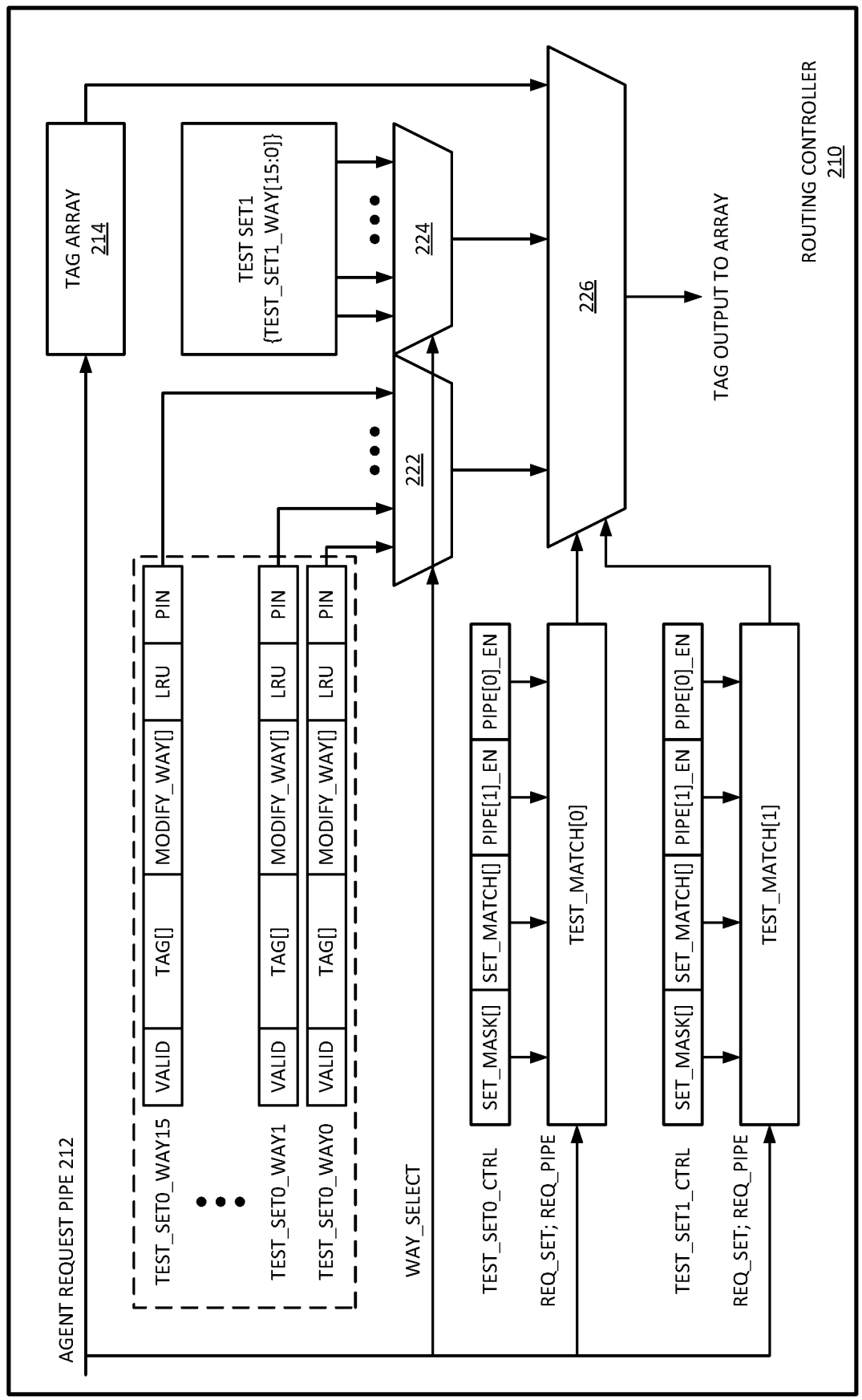
FIG. 2 is a block diagram of an example of a routing controller for a multilevel memory system with way selection.

FIG. 2 is a block diagram of an example of a routing controller for a multilevel memory system with way selection. Routing controller 210 provides one example of access control logic 130 of FIG. 1. Routing controller 210 includes a traditional data pathway through tag array 214. Thus, agent request pipe 212 can be provided to tag array 214 for standard operation of routing controller 210.

In one example, agent request pipe 212 can also be provided to test hardware that provides one or more pathways in parallel with the pathway of tag array 214. In one example, the pathway through tag array 214 is the traditional pathway, and all other logic within routing controller 210 is additional logic to provide the ability to modify incoming memory address matching to selectively route traffic.

In one example, routing controller 210 includes Test Set0 and Test Set1. The test sets can refer to sets for local testing hardware (e.g., LOFT hardware). As illustrated, the test sets include 16 ways in each set. Reference to ways and sets refers to the configuration of tag information in accordance with a caching implementation. The tag information can be an array with sets as rows in the array, and the ways as columns of the array. The information in the different array locations provides a mapping to a memory location.

An example of the data of the array is provided for Test Set0. While not specified for Test Set1, it will be understood that Test Set1 can include the same or similar information. In example, each way includes a valid bit to indicate validity of the data at the memory location. Tag[ ] represents multiple bits to indicate a tag value. In one example, the tag value includes 7 bits (i.e., Tag[6:0]). Modify_Way[ ] represents modification bits. In one example, each way includes 7 modification bits (i.e., Modify_Way[6:0]). LRU can refer to a least recently used indication bit. Pin can refer to a bit to indicate whether or not the data is pinned in memory. Additional information can be included beyond what is depicted in the test sets. Different implementations can utilize different numbers of bits for the tag information.

Routing controller 210 illustrates multiplexing logic (mux) 222 for Test Set0 and mux 224 for Test Set1. The multiplexers can be considered part of the logic of the test sets. Thus, another representation of routing controller 210 can include the multiplexing logic implied in the blocks that represent the test sets. In one example, routing controller 210 includes different sets for different halves of tag array 214, which can provide more flexibility for testing. For example, Test Set0 can provide control over ways for one half of tag array 214, and Test Set1 can provide control over the other half.

In one example, the way selection can control the selection of muxes 222 and 224. Way_select can determine which way is provided as tag information for output selection by mux 226. Mux 226 can select the tag information from tag array 214, which is the standard tag array. Mux 226 can alternatively select the tag information from Test Set0 or Test Set1. Mux 226 can be controlled through selection control provided by Test_Match[0] and Test_Match[1]. The test matching control logic can provide mask control to select specific sets.

In one example, the test match logic responds to configurable logic, and can be, for example, stored in registers. The control is illustrated by the configurable elements shown providing input to Test_Match[0] and Test_Match[1], which are labeled as Test_Set0_Ctrl and Test_Set1_Ctrl. Registers are provided as examples, but will be understood as one implementation of control logic. Other control logic can be alternatively used. In one example, the registers can include Set_Mask[ ], which represents bits to select a set mask to filter the set information. In one example, Set_Mask includes 15 bits (i.e., Set_Mask[14:0]). In one example, the registers can include Set_Match[ ], which represents bits to provide a match to a specific set. In one example, Set_Match includes 15 bits (i.e., Set_Match[14:0]). The set mask does not necessarily include the same number of bits as the set match in all implementations.

In one example, the registers can include Pipe[1]_En and Pipe[0]_En. The pipe enable bits can provide ability to selectively enable the Test Set pipes. Thus, for example, one or more pipes or channels of test set tag information can be selectively enabled. The enabling of more set information provides more opportunity for testing different streams of traffic, which provides more cache hit/miss/evict scenarios. In one example, Test_Match[0] and Test_Match[1] are controlled through control signals of the request set (Req_Set) and request pipe (Req_Pipe).

In one example, the test set arrays are programmable and provide a register for each way in tag array 214. In one example, routing controller 210 enables the programming of various attributes of the tag information to provide alternate tag information to the native tag information of the incoming data requests. In one example, routing controller 210 includes two channels of test control, and the control logic can provide further granularity of masking the incoming fields of the tag information to perform matches on the incoming transactions. In one example, the routing controller intercepts the incoming memory transaction and conditionally intercepts the incoming addresses. In one example, each memory access request includes tag information, and there is data and tag information for each location.

In one example where registers are used, the hardware of routing controller 210 matches set, way, tag, or other information to the fields in the programmed registers and creates a cacheline hit or a miss. The hardware passes the results to the controller pipe, and the output can be selected as the tag output to the memory array. The capabilities of routing controller 210 enable the ability to match on incoming transactions, for example, "way (total #16 ways)", "set (#128K)", and replace it with pre-programmed ways and sets. In one example, the logic of the test matching logic concludes there is a match based on a logical operation such as Match=((Req_Set & Set_Mask)==(Set_Match & Set_Mask)) && Pipe_En(Req_Pipe). A cacheline hit indicates that the data is stored in NM. A cacheline miss indicates that the 2LM should look to FM. Consider an example where a data access request includes tag information with native way information Way1. The hardware of routing controller 210 can modify one or more fields related to Way1.

The programmed fields can be provided to mux 226 along with the CPU tag fields from tag array 214. For address matches, the mux can output the tag information. The programming of the tag information enables the system to selectively trigger matches. In one example, mux 226 represents a comparator array, which compares selected tag information to received tag information. The modified tag information can include the modifications to direct the request to a desired location. The received tag information can include the original tag information and the test set information.

Figure 3A:
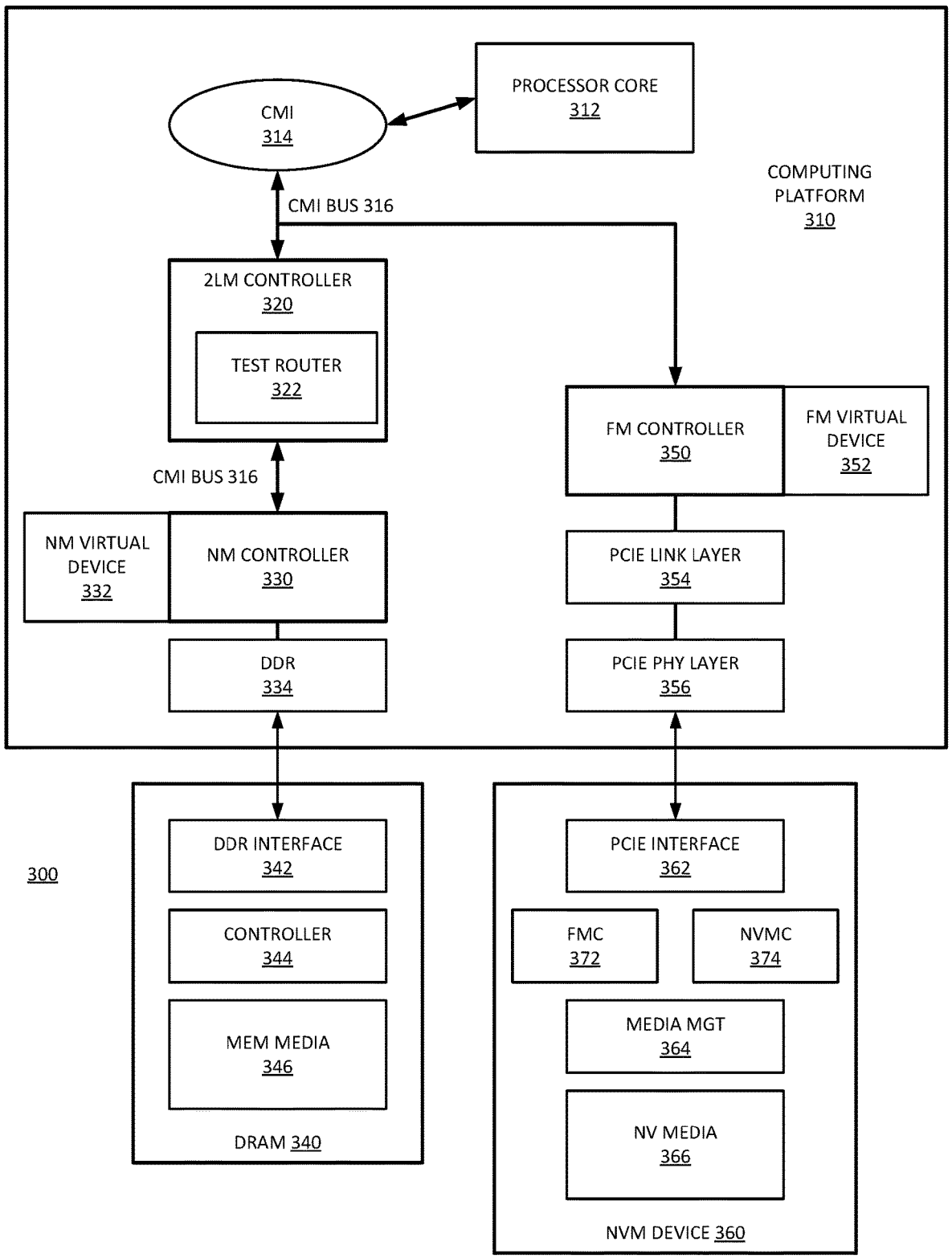
FIG. 3A is a block diagram of an example of a computing platform with on-board testing and test traffic routing.

FIG. 3A is a block diagram of an example of a computing platform with on-board testing and test traffic routing. System 300 provides one example of a system that includes a dynamically programmable traffic router in accordance with routing controller 210 of FIG. 2 or access control 130 of FIG. 1. System 300 includes computing platform 310, which represents a hardware platform incorporating a multilevel memory controller capable to route test traffic differently than indicated by native tag information for a data access request. A data access request can include a read request, a write request, or combination of read and write. System 300 also illustrates DRAM 340 as near memory, and NVM device 360 as far memory. It will be understood that in a testing context, DRAM 340 and NVM device 360 may not actually be connected to computing platform 310. However, computing platform 310 is configured for incorporation into a computing device that includes near memory and far memory.

In one example, computing platform 310 includes processor core 312. A single block is illustrated for processor core 312, but it will be understood that computing platform 310 can include a multicore processor, and thus include multiple processor cores 312. Computing platform 310 includes 2LM controller 320 or other multilevel memory controller. 2LM controller includes test router 322, which represents one or more components of dynamically programmable hardware within computing platform 310. Test router 322 can include hardware to provide data pathways in parallel to a pathway for use in normal operation of computing platform 310.

In one example, processor core 312 couples to 2LM controller 320 via CMI (converged memory interface) 314. CMI 314 includes CMI bus 316 to interface with different memory controllers in computing platform 310. CMI bus 316 can include multiple signal lines that provide an interface for multiple different types of memory technologies. Thus, the CMI is a converged memory interface because it interfaces to different types of memory.

As illustrated, 2LM controller 320 can sit on CMI bus 316 or be connected to CMI bus 316, and interface with NM controller 330 and FM controller 350. NM controller 330 represents a near memory controller to control access to DRAM 340. In one example, NM controller 330 includes or is coupled to NM virtual device 332, which represents logic to provide a virtual memory access path to near memory. In one example, FM controller 350 includes or is coupled to FM virtual device 352, which represents logic to provide a virtual memory access path to far memory.

NM controller 330 is coupled to the near memory through an appropriate interface for the memory type. In the case of DRAM 340, NM controller 330 is illustrated as connecting to DRAM 340 via DDR interface 334. DDR interface 334 represents hardware to interconnect with DDR memory resources, such as a DIMM (dual inline memory module) or DRAM device. Other memory types and corresponding interfaces can be used in place of DDR memory. In one example, NM virtual device 332 provides an alternate, virtual, memory access path for NM controller 330. Consider a memory access test with a request or stream of requests to DRAM 340. Instead of sending the requests to DRAM 340, NM virtual device 332 can provide storage of tag information to return virtual responses to requests intended for DRAM 340.

Similarly, FM controller 350 is coupled to the far memory through an appropriate interface for the memory type, such as a 3DXP interface. In one example, FM controller 350 is illustrated as connecting to NVM (nonvolatile memory) device 360 via a PCIe interface. As illustrated, the PCIe interface can include a PCIe link layer 354 and PCIe physical (PHY) layer 356. Other interfaces can be used in place of PCI. In one example, FM virtual device 352 provides an alternate, virtual, memory access path for FM controller 350. Consider a memory access test with a request or stream of requests to NVM device 360. Instead of sending the requests to NVM device 360, FM virtual device 352 can provide storage of tag information to return virtual responses to requests intended for NVM device 360.

In one example, DRAM 340 will include DDR interface 342 to couple to the interface of computing platform 310. DRAM 340 includes controller 344, which represents an in-memory controller to decode incoming memory access commands and perform the operations internal to DRAM 340 to execute the commands. Controller 344 is internal to the memory device, and creates internal operations and commands, and is understood to be separate from the memory controller of the host, such as 2LM controller 320. DRAM 340 includes memory (MEM) media 346, which represents the storage array of the memory. Memory media 346 includes volatile memory locations addressable by byte.

In one example, NVM device 360 will include PCIe interface to couple to the interface of computing platform 310. NVM device 360 includes NV media 366, which represents the storage array of the NVM device. NV media 366 can include charge-based storage, or phase-based storage or other resistance-based storage. Media management (mgt) 364 represents control logic to control access to and manage the storage of, NV media 366. In one example, NVM device 360 includes FMC (far memory controller) 372, which represents logic on NVM device 360 to control the memory as a far memory device. As a far memory device, NVM device 360 operates to store data as part of system memory, with byte-addressability. FMC 372 can control the timing, decoding, and addressing of commands for the nonvolatile media. In one example, NVM device 360 includes NVMC (nonvolatile memory controller) 374, which represents a controller internal to NVM device 360. NVMC 374 provides control over internal command generation and internal operations to process and execute commands sent from the host, such as 2LM controller 320.

In one example, NM virtual device 332 and FM virtual device 352 include some storage, such as registers or other memory resources to storage a certain amount of memory access state. The amount of state needed will depend on how the testing is configured and executed. In one example, NM virtual device 332 and FM virtual device 352 can respond to the incoming traffic in the absence of an external device controllers for the near memory (e.g., controller 344) or for the far memory (e.g., FMC 372, NVMC 374), respectively. The use of the virtual devices can enable an OEM to determine if NM interfaces and FM interfaces work, without having to attach external chips or devices. Thus, system 300 can test the memory access pathways without having to send a request to a physical memory device (e.g., either a NM physical device, or a FM physical device, or either one).

In one example, 2LM controller 320 can receive a data request from processor core 312. The data request can include original tag information to direct a memory access request natively to either NM controller 330 for a NM subsystem, or to FM controller 350 for a FM subsystem. With test router 322, 2LM controller can selectively provide alternate tag information for the data request to cause a cache hit or a cache miss to selectively direct the request to the NM subsystem or to the FM subsystem. A cache hit refers to a determination that the data is stored in near memory, and a cache miss indicates that the data is not stored in near memory. With a 2LM system, when data is not stored in near memory, 2LM controller 320 will automatically check the far memory. Test router 322 can provide hardware to manipulate or modify tag information to redirect traffic, and can include selection logic to select between the original tag information and the alternate tag information to control where a data access request is directed.

Figure 3B:
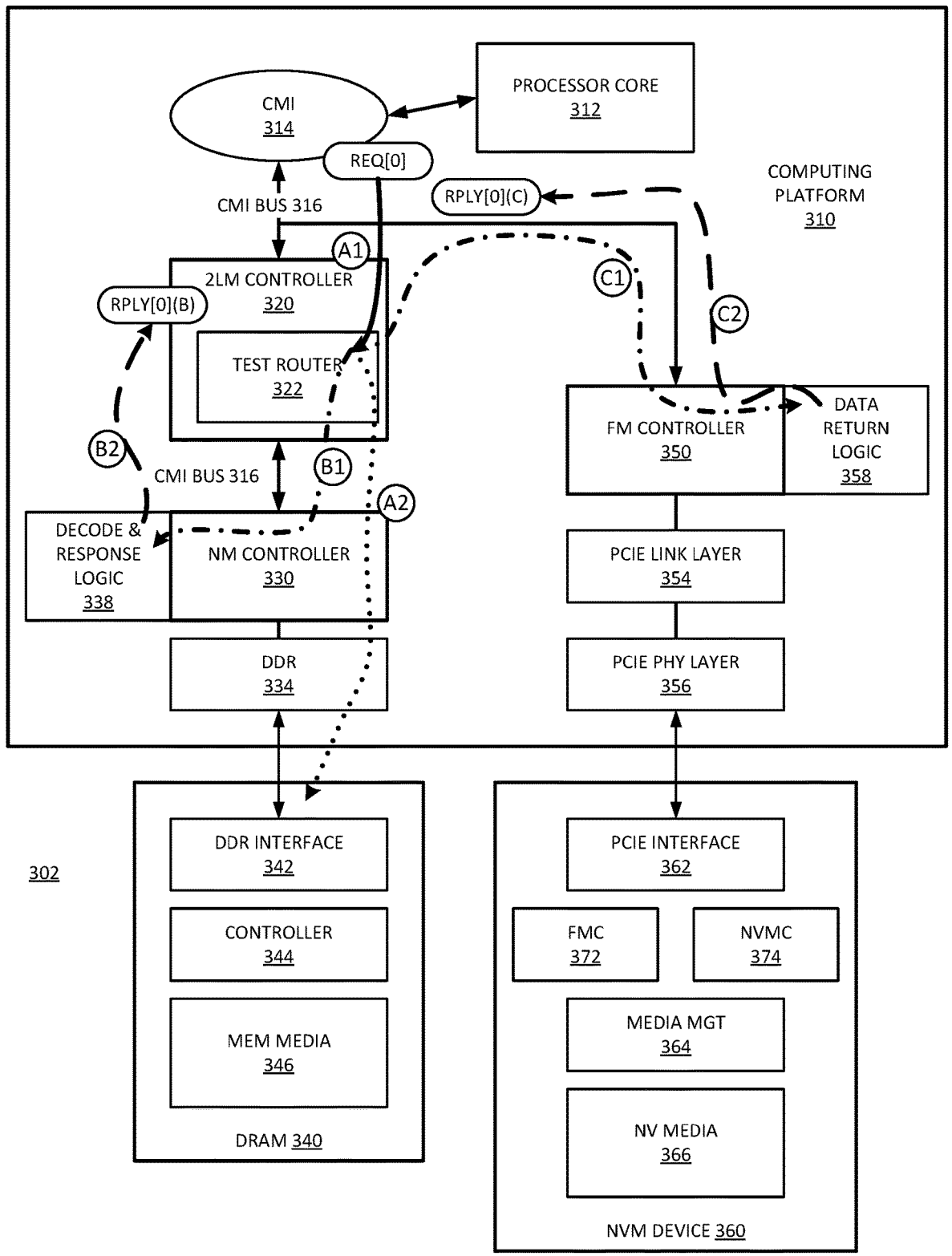
FIG. 3B is a block diagram of an example of a computing platform with on-board testing and test traffic routing to re-route traffic designated for a near memory device.

FIG. 3B is a block diagram of an example of a computing platform with on-board testing and test traffic routing to re-route traffic designated for a near memory device. System 302 represents an example of system 300, illustrating how 2LM controller 320 can direct a request having native tag information for DRAM 340.

Consider Req[0] generated by processor core 312, and sent to 2LM controller 320 over CMI bus 316. Req[0] has native tag information to direct the request to DRAM 340. As illustrated in system 302, A1 illustrates Req[0] being received at test router 322 of 2LM controller 320. Dashed segment A2 illustrates the native direction of Req[0] to DRAM 340. Test router 322 can manipulate or modify the tag information. Thus, test router 322 can change tag information for channel, way, or set, or a combination of information. As such, system 302 can modify outgoing address information to redirect a request.

In one example, consider that test router 322 can isolate one level memory (1LM) testing from two level memory (2LM) testing. Segment B1 represents a redirection of Req[0] to a virtual device associated with NM controller 330. The virtual device is represented by the decode & response logic 338. When redirected to decode & response logic 338, the virtual device logic can respond to the request without having to send the request to external DRAM 340, as illustrated by segment B2. As shown by segment B2, the virtual device provides Reply[0] for "route B" as illustrated by B1 and B2.

In one example, assume that test router 322 redirects Req[0] to a virtual device associated with FM controller 350. The virtual device is represented by the data return logic 358, as illustrated by segment C1. When redirected to data return logic 358, the virtual device logic can respond to the request without having to send the request to external NVM device 360, as illustrated by segment C2. As shown by segment C2, the virtual device provides Reply[0] for "route C" as illustrated by C1 and C2.

Thus, system 302 can redirect traffic intended for near memory to be processed without sending to an external device, or can redirect the traffic to far memory instead of near memory. In one example, the response in near memory can be a redirection to a different way or set than what is indicated in native tag information.

Figure 3C:
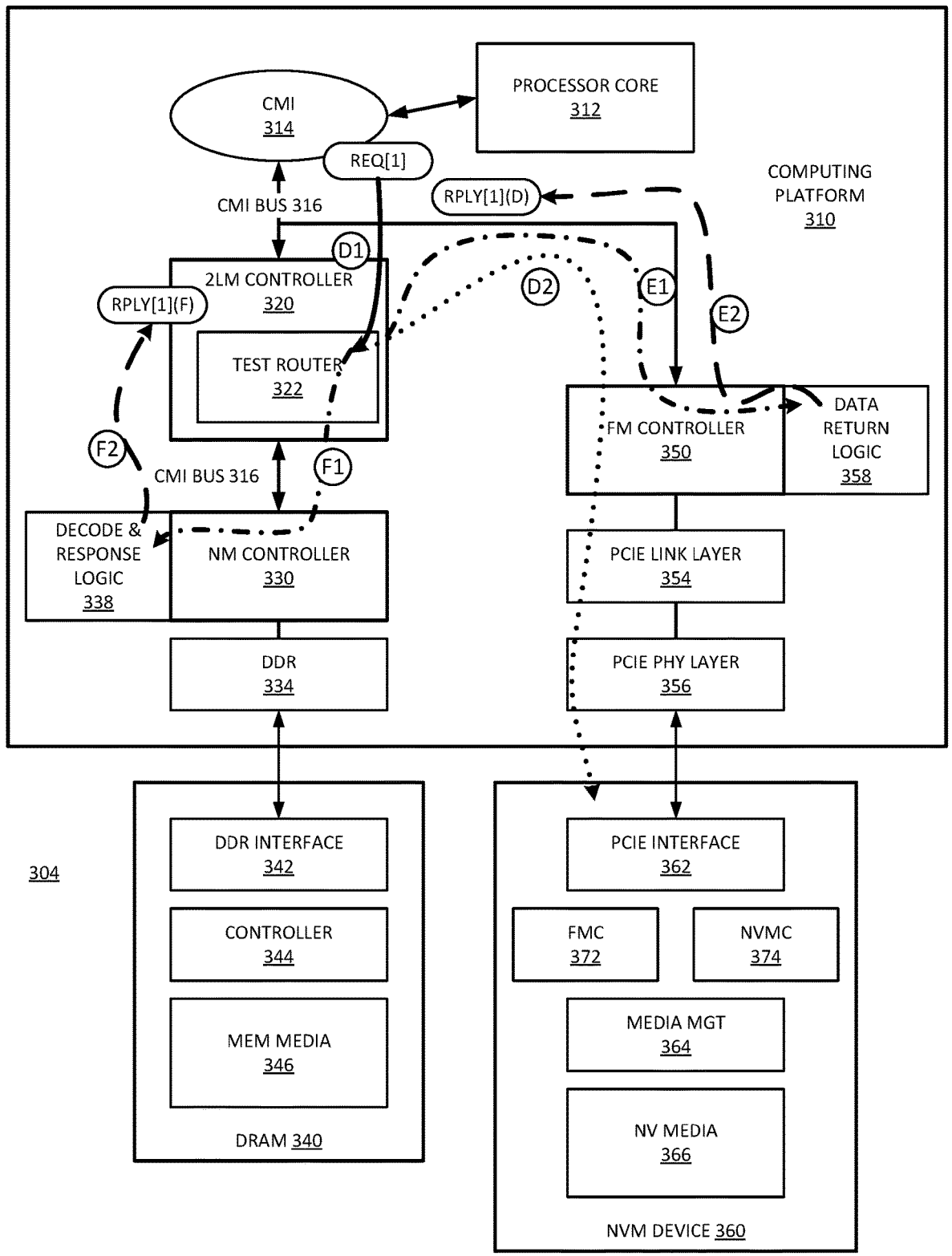
FIG. 3C is a block diagram of an example of a computing platform with on-board testing and test traffic routing to re-route traffic designated for a far memory device.

FIG. 3C is a block diagram of an example of a computing platform with on-board testing and test traffic routing to re-route traffic designated for a far memory device. System 304 represents an example of system 300, illustrating how 2LM controller 320 can direct a request having native tag information for NVM device 360.

Consider Req[1] generated by processor core 312, and sent to 2LM controller 320 over CMI bus 316. Req[1] has native tag information to direct the request to NVM device 360. As illustrated in system 304, D1 illustrates Req[1] being received at test router 322 of 2LM controller 320. Dashed segment D2 illustrates the native direction of Req[1] to NVM device 360. Test router 322 can manipulate or modify the tag information. Thus, test router 322 can change tag information for channel, way, or set, or a combination of information. As such, system 302 can modify outgoing address information to redirect the request.

In one example, assume that test router 322 redirects Req[1] to a virtual device associated with FM controller 350. The virtual device is represented by the data return logic 358, as illustrated by segment E1. When redirected to data return logic 358, the virtual device logic can respond to the request without having to send the request to external NVM device 360, as illustrated by segment E2. As shown by segment E2, the virtual device provides Reply[1] for "route E" as illustrated by E1 and E2.

Segment F1 represents a redirection of Req[1] to a virtual device associated with NM controller 330. The virtual device is represented by the decode & response logic 338. When redirected to decode & response logic 338, the virtual device logic can respond to the request without having to send the request to external DRAM 340, as illustrated by segment F2. As shown by segment F2, the virtual device provides Reply[1] for "route F" as illustrated by F1 and F2.

Thus, system 302 can redirect traffic intended for far memory to be processed without sending to an external device, or can redirect the traffic to near memory instead of far memory. In one example, the response in far memory can be a redirection to a different way or set than what is indicated in native tag information.

Figure 4:
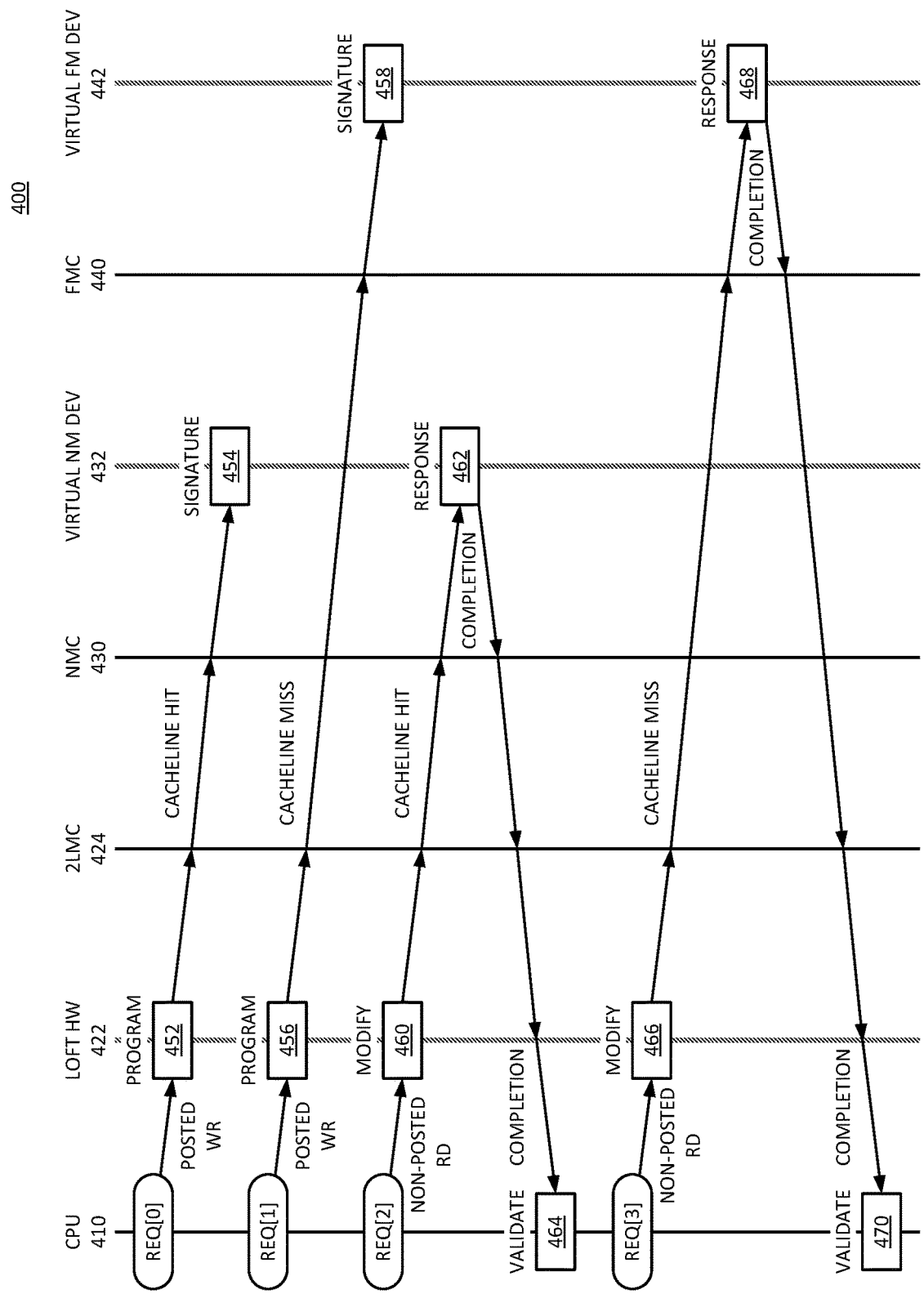
FIG. 4 is a representation of transaction flow with embedded testing hardware in a computing platform.

FIG. 4 is a representation of transaction flow with embedded testing hardware in a computing platform. Diagram 400 illustrates a swimlane diagram that represents an example of the transaction flow from CPU 410 through test hardware. The test hardware includes LOFT hardware 422, virtual NM device 432, and virtual FM device 442. The 2LMC (2LM controller) 424, NMC (near memory controller) 430, and FMC (far memory controller) 440 can perform their standard functions of routing traffic based on tag information in the data requests received. The modification of the tag information described herein enables these devices to redirect the traffic based on the modification of tag information. LOFT hardware 422, virtual NM device 432, and virtual FM device 442 can be embedded components that provide an alternate data path to the operational data path provided by normal operation.

In one example, an initial state of the test system for diagram 400 is that the tag array cache for 2LMC is empty.

The testing system can generate traffic for the testing. The testing system can be or include an HVM (high volume manufacturing) test write, an in-field debugger, a BIOS program, or other test system or test source. In one example, the test system programs LOFT hardware sets (e.g., LOFT-0 and LOFT-1 sets) for various matching ways, sets, masking fields, or other configurations. The programmed values eventually determine whether the user or test system intends the transaction to result in a cache miss or cache hit.

In one example, the host issues a non-posted memory read transaction with an address. In one example, the computer platform includes a ring network as a CMI interface and associated bus. After traversing through the ring network, the 2LMC will decide the request. The decoding results will be conditionally overwritten by the LOFT programming (e.g., programming data stored in LOFT registers). Initially all data transactions should result in cache misses since the tag array is empty. However, the LOFT programming can generate a "hit" even in an empty cache. As such, the programming can selectively direct transactions to either the NMC or the FMC, as desired for the testing. In one example, when a virtual device (e.g., hardware in the respective controller) decodes a transaction as a non-posted request, the virtual device responds with completion. In one example, the virtual device also collects the signature of the transaction for final comparison.

In one example, the completion issued by the virtual device reaches the CPU, and the CPU collects the signature on the incoming transaction. The CPU can compare the signature to the expected (golden) value to determine if the transaction is a pass or a fail. Thus, the test system can test the pathway for the data requests. The virtual devices can be considered embodiments of the respective memory devices their controllers are to be connected to. Whether or not the testing is performed prior to incorporation in a device when there are no hardware memory devices connected, or whether the testing is performed in the field when hardware memory devices are connected, the virtual devices operate as proxies for the memory devices, and the memory devices do not need to be involved in the testing. In one example, the virtual devices receive the write transactions and keep track of the state for purposes of read. The virtual devices can send the data back for a read.

Consider Req[0], which is a request generated by CPU 410 (e.g., the host), which is a posted write. A posted write is a write transaction that does not wait for a write completion response. For a posted write, CPU 410 may assume that the write transaction will complete, and does not wait for an indication of success or failure of the transaction. In one example, LOFT hardware 422 receives the request, and can program the request tag information at 452 to result in a cacheline hit (whether or not the request would result in a cacheline hit). LOFT hardware 422 send the request to 2LMC 424, which forwards the requests to NMC 430, seeing that the request appears to be a cache hit. In one example, NMC 430 forwards the request to virtual NM device 432 for processing. Seeing that the transaction is non-posted, the virtual device can record a signature for the device at 454, and does not need to provide a transaction success/failure indication.

For Req[1], the request is another posted write request generated by CPU 410. Instead of directing the request as a cacheline hit, LOFT hardware 422 can program the request as a cacheline miss at 456. As a cacheline miss, 2LMC 424 will forward the request to FMC 440. FMC 440 can then forward the request to virtual FM device 442 for processing and signature at 458.

For Req[2], the request is a non-posted read request from CPU 410. A non-posted request requires a response to indicate success or failure of the transaction. Typically a read request is non-posted because the CPU typically wants the data returned for a read request. Thus, non-posted transactions wait for a response. In one example, LOFT hardware 422 generates a cacheline hit for Req[2] at 460, which directs the transaction to virtual NM device 432 through 2LMC 422 and NMC 430. Virtual NM device 432 can record a signature, and generate a response at 462. Thus, the virtual device can indicate a completion that is directed back to CPU 410 through NMC 430, 2LMC 424, and LOFT hardware 422. CPU 410 can validate the transaction completion at 464, and determine the success or failure of the test transaction.

For Req[3], the request is a non-posted read request from CPU 410. In one example, LOFT hardware 422 generates a cacheline miss for Req[3] at 466 by modifying the tag information, to direct the transaction to virtual FM device 442 through 2LMC 422 and FMC 440. Virtual FM device 442 can record a signature, and generate a response at 468. Thus, the virtual device can indicate a completion that is directed back to CPU 410 through FMC 440, 2LMC 424, and LOFT hardware 422. CPU 410 can validate the transaction completion at 470, and determine the success or failure of the test transaction.

Figure 5:
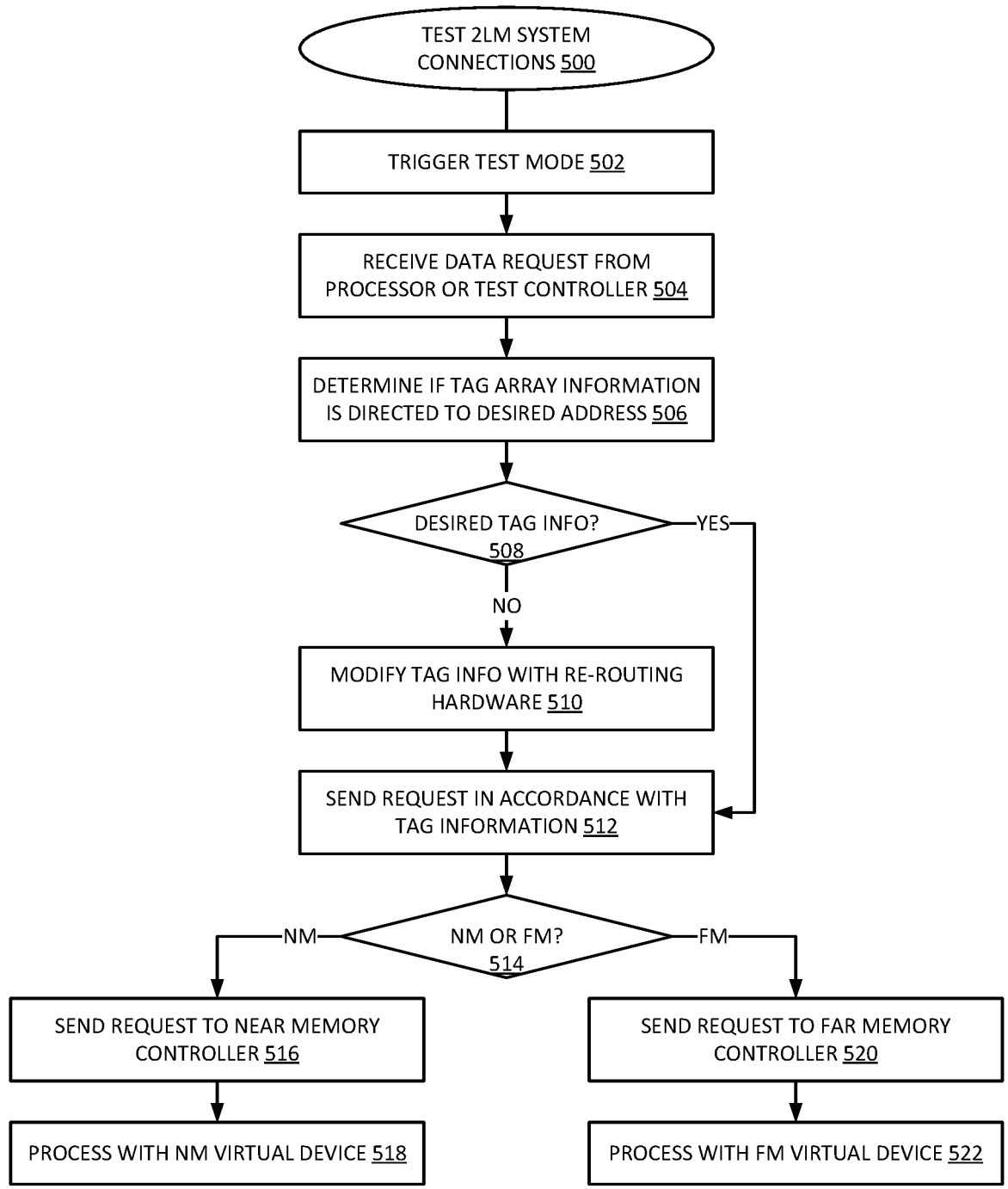
FIG. 5 is a flow diagram of an example of a process for routing test traffic in a multilevel memory system.

FIG. 5 is a flow diagram of an example of a process for routing test traffic in a multilevel memory system. Process 500 provides an example of testing 2LM system connections. In one example, the system triggers a test mode, 502. The test mode can be triggered, for example, by the writing of a mode register or other configuration setting. In the test mode, the embedded hardware is enabled, which activates alternate data path or paths to provide testing capability for the memory subsystems. The embedded hardware can modify address information or tag information to redirect traffic to selected memory subsystems.

In one example, the test hardware (e.g., LOFT hardware of a 2LM controller) receives a data request from a processor or test controller 504. In one example, the test hardware determines if the tag array information is directed to a desired address or a desired memory subsystem, 506. If the tag information is the desired tag information, 508 YES branch, the controller can send the request in accordance with the tag information, 512. If the information is not the desire tag information, 508 NO branch, the test hardware can modify the tag information with re-routing hardware, 510. The controller can then send the data request in accordance with the modified tag information, 512.

If the tag information is selectively controlled to direct the request to near memory, 514 NM branch, the controller can send the request to the near memory controller, 516. In one example, the near memory controller includes a virtual NM device. The virtual NM device can process the request in place of a NM physical device, 518.

If the tag information is selectively controlled to direct the request to far memory, 514 FM branch, the controller can send the request to the far memory controller, 520. In one example, the far memory controller includes a virtual FM device. The virtual FM device can process the request in place of a FM physical device, 522.

Figure 6:
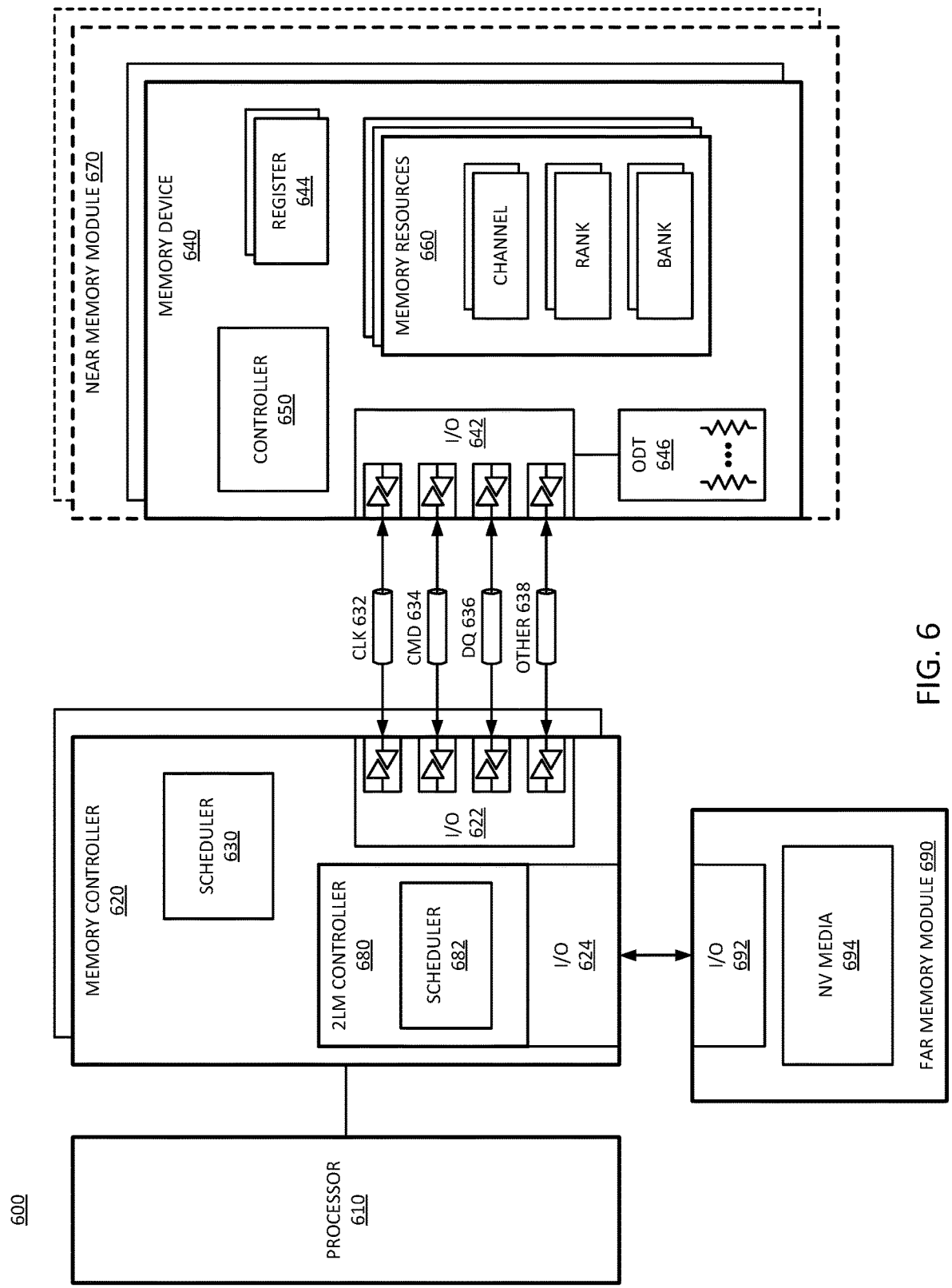
FIG. 6 is a block diagram of an example of a memory subsystem with a multilevel memory controller with embedded traffic routing.

FIG. 6 is a block diagram of an example of a memory subsystem with a multilevel memory controller with embedded traffic routing. System 600 includes a processor and elements of a memory subsystem in a computing device.

System 600 can operate as a 2LM system with far memory module 690 having a longer access delay than near memory module 670. In one example, memory controller 620 includes 2LM controller 680. 2LM controller 680 represents a 2LM controller in accordance with any example described herein. 2LM controller 680 includes logic to modify tag information for requests from host processor 610. In one example, cache controller 680 is separate from memory controller 620. 2LM controller 680 can be a subset of scheduler 630, in one example. 2LM controller 680 is also illustrated to include scheduler 682, which is similar in form and function with scheduler 630, or which is part of scheduler 630. Scheduler 682 represents the scheduling function for transactions related to access and management of far memory module 690, while scheduler 630 more specifically represents the scheduling function for memory device 640.

In one example, far memory module 690 represents far memory, and scheduler 682 schedules the transactions for access to far memory. In one example, near memory module 670 is a main memory module, and scheduler 630 schedules the transactions for access to near memory.

In response to scheduling of transactions for memory device 640, memory controller 620 can issue commands via I/O 622 to cause memory device 640 to execute the commands. In a similar manner, 2LM controller 680 can issue access commands via I/O 624 to I/O 692 of far memory module 690. While the specific internal structure of memory within far memory module 690 is not illustrated, in one example, it is the same or similar to memory device 640. I/O 624 can be the same or similar to I/O 622, with one or more buses provided via signal lines that couple far memory module 690 to memory controller 620.

Processor 610 represents a processing unit of a computing platform that may execute an operating system (OS) and applications, which can collectively be referred to as the host or the user of the memory. The OS and applications execute operations that result in memory accesses. Processor 610 can include one or more separate processors. Each separate processor can include a single processing unit, a multicore processing unit, or a combination. The processing unit can be a primary processor such as a CPU (central processing unit), a peripheral processor such as a GPU (graphics processing unit), or a combination. Memory accesses may also be initiated by devices such as a network controller or hard disk controller. Such devices can be integrated with the processor in some systems or attached to the processer via a bus (e.g., PCI express), or a combination. System 600 can be implemented as an SOC (system on a chip), or be implemented with standalone components.

Reference to memory devices can apply to different memory types. Memory devices often refers to volatile memory technologies. Volatile memory is memory whose state (and therefore the data stored on it) is indeterminate if power is interrupted to the device. Nonvolatile memory refers to memory whose state is determinate even if power is interrupted to the device. Dynamic volatile memory requires refreshing the data stored in the device to maintain state. One example of dynamic volatile memory includes DRAM (dynamic random access memory), or some variant such as synchronous DRAM (SDRAM). A memory subsystem as described herein may be compatible with a number of memory technologies, such as DDR4 (DDR version 4, JESD79, initial specification published in September 2012 by JEDEC), LPDDR4 (low power DDR version 4, JESD209-4, originally published by JEDEC in August 2014), WIO2 (Wide I/O 2 (WideIO2), JESD229-2, originally published by JEDEC in August 2014), HBM (high bandwidth memory DRAM, JESD235A, originally published by JEDEC in November 2015), DDR5 (DDR version 5, currently in discussion by JEDEC), LPDDR5 (currently in discussion by JEDEC), HBM2 ((HBM version 2), currently in discussion by JEDEC), or others or combinations of memory technologies, and technologies based on derivatives or extensions of such specifications.

In addition to, or alternatively to, volatile memory, in one example, reference to memory devices can refer to a nonvolatile memory device whose state is determinate even if power is interrupted to the device. In one example, the nonvolatile memory device is a block addressable memory device, such as NAND or NOR technologies. Thus, a memory device can also include a future generation nonvolatile devices, such as a three dimensional crosspoint memory device, other byte addressable nonvolatile memory devices, or memory devices that use chalcogenide phase change material (e.g., chalcogenide glass). In one example, the memory device can be or include multi-threshold level NAND flash memory, NOR flash memory, single or multi-level phase change memory (PCM) or phase change memory with a switch (PCMS), a resistive memory, nanowire memory, ferroelectric transistor random access memory (FeTRAM), magnetoresistive random access memory (MRAM) memory that incorporates memristor technology, or spin transfer torque (STT)-MRAM, or a combination of any of the above, or other memory.

Descriptions herein referring to a "RAM" or "RAM device" can apply to any memory device that allows random access, whether volatile or nonvolatile. Descriptions referring to a "DRAM" or a "DRAM device" can refer to a volatile random access memory device. The memory device or DRAM can refer to the die itself, to a packaged memory product that includes one or more dies, or both. In one example, a system with volatile memory that needs to be refreshed can also include nonvolatile memory. In one example, memory device 640 includes volatile memory, while NV media 694 includes nonvolatile memory.

Memory controller 620 represents one or more memory controller circuits or devices for system 600. Memory controller 620 represents control logic that generates memory access commands in response to the execution of operations by processor 610. Memory controller 620 accesses one or more memory devices 640. Memory devices 640 can be DRAM devices in accordance with any referred to above. In one example, memory devices 640 are organized and managed as different channels, where each channel couples to buses and signal lines that couple to multiple memory devices in parallel. Each channel is independently operable. Thus, each channel is independently accessed and controlled, and the timing, data transfer, command and address exchanges, and other operations are separate for each channel. Coupling can refer to an electrical coupling, communicative coupling, physical coupling, or a combination of these. Physical coupling can include direct contact. Electrical coupling includes an interface or interconnection that allows electrical flow between components, or allows signaling between components, or both. Communicative coupling includes connections, including wired or wireless, that enable components to exchange data.

In one example, settings for each channel are controlled by separate mode registers or other register settings. In one example, each memory controller 620 manages a separate memory channel, although system 600 can be configured to have multiple channels managed by a single controller, or to have multiple controllers on a single channel. In one example, memory controller 620 is part of host processor 610, such as logic implemented on the same die or implemented in the same package space as the processor.

Memory controller 620 includes I/O interface logic 622 to couple to a memory bus, such as a memory channel as referred to above. I/O interface logic 622 (as well as I/O interface logic 642 of memory device 640) can include pins, pads, connectors, signal lines, traces, or wires, or other hardware to connect the devices, or a combination of these. I/O interface logic 622 can include a hardware interface. As illustrated, I/O interface logic 622 includes at least drivers/transceivers for signal lines. Commonly, wires within an integrated circuit interface couple with a pad, pin, or connector to interface signal lines or traces or other wires between devices. I/O interface logic 622 can include drivers, receivers, transceivers, or termination, or other circuitry or combinations of circuitry to exchange signals on the signal lines between the devices. The exchange of signals includes at least one of transmit or receive. While shown as coupling I/O 622 from memory controller 620 to I/O 642 of memory device 640, it will be understood that in an implementation of system 600 where groups of memory devices 640 are accessed in parallel, multiple memory devices can include I/O interfaces to the same interface of memory controller 620. In an implementation of system 600 including one or more memory modules 670, I/O 642 can include interface hardware of the memory module in addition to interface hardware on the memory device itself. Other memory controllers 620 will include separate interfaces to other memory devices 640.

The bus between memory controller 620 and memory devices 640 can be implemented as multiple signal lines coupling memory controller 620 to memory devices 640. The bus may typically include at least clock (CLK) 632, command/address (CMD) 634, and write data (DQ) and read data (DQ) 636, and zero or more other signal lines 638. In one example, a bus or connection between memory controller 620 and memory can be referred to as a memory bus. The signal lines for CMD can be referred to as a "C/A bus" (or ADD/CMD bus, or some other designation indicating the transfer of commands (C or CMD) and address (A or ADD) information) and the signal lines for write and read DQ can be referred to as a "data bus." In one example, independent channels have different clock signals, C/A buses, data buses, and other signal lines. Thus, system 600 can be considered to have multiple "buses," in the sense that an independent interface path can be considered a separate bus. It will be understood that in addition to the lines explicitly shown, a bus can include at least one of strobe signaling lines, alert lines, auxiliary lines, or other signal lines, or a combination. It will also be understood that serial bus technologies can be used for the connection between memory controller 620 and memory devices 640. An example of a serial bus technology is 86106 encoding and transmission of high-speed data with embedded clock over a single differential pair of signals in each direction. In one example, CMD 634 represents signal lines shared in parallel with multiple memory devices. In one example, multiple memory devices share encoding command signal lines of CMD 634, and each has a separate chip select (CS_n) signal line to select individual memory devices.

It will be understood that in the example of system 600, the bus between memory controller 620 and memory devices 640 includes a subsidiary command bus CMD 634 and a subsidiary bus to carry the write and read data, DQ 636. In one example, the data bus can include bidirectional lines for read data and for write/command data. In another example, the subsidiary bus DQ 636 can include unidirectional write signal lines for write and data from the host to memory, and can include unidirectional lines for read data from the memory to the host. In accordance with the chosen memory technology and system design, other signals 638 may accompany a bus or sub bus, such as strobe lines DQS. Based on design of system 600, or implementation if a design supports multiple implementations, the data bus can have more or less bandwidth per memory device 640. For example, the data bus can support memory devices that have either a x32 interface, a x16 interface, a x8 interface, or other interface. The convention "xW," where W is an integer that refers to an interface size or width of the interface of memory device 640, which represents a number of signal lines to exchange data with memory controller 620. The interface size of the memory devices is a controlling factor on how many memory devices can be used concurrently per channel in system 600 or coupled in parallel to the same signal lines. In one example, high bandwidth memory devices, wide interface devices, or stacked memory configurations, or combinations, can enable wider interfaces, such as a x128 interface, a x256 interface, a x512 interface, a x1024 interface, or other data bus interface width.

In one example, memory devices 640 and memory controller 620 exchange data over the data bus in a burst, or a sequence of consecutive data transfers. The burst corresponds to a number of transfer cycles, which is related to a bus frequency. In one example, the transfer cycle can be a whole clock cycle for transfers occurring on a same clock or strobe signal edge (e.g., on the rising edge). In one example, every clock cycle, referring to a cycle of the system clock, is separated into multiple unit intervals (UIs), where each UI is a transfer cycle. For example, double data rate transfers trigger on both edges of the clock signal (e.g., rising and falling). A burst can last for a configured number of UIs, which can be a configuration stored in a register, or triggered on the fly. For example, a sequence of eight consecutive transfer periods can be considered a burst length 8 (BL8), and each memory device 640 can transfer data on each UI. Thus, a x8 memory device operating on BL8 can transfer 64 bits of data (8 data signal lines times 8 data bits transferred per line over the burst). It will be understood that this simple example is merely an illustration and is not limiting.

Memory devices 640 represent memory resources for system 600. In one example, each memory device 640 is a separate memory die. In one example, each memory device 640 can interface with multiple (e.g., 2) channels per device or die. Each memory device 640 includes I/O interface logic 642, which has a bandwidth determined by the implementation of the device (e.g., x16 or x8 or some other interface bandwidth). I/O interface logic 642 enables the memory devices to interface with memory controller 620. I/O interface logic 642 can include a hardware interface, and can be in accordance with I/O 622 of memory controller, but at the memory device end. In one example, multiple memory devices 640 are connected in parallel to the same command and data buses. In another example, multiple memory devices 640 are connected in parallel to the same command bus, and are connected to different data buses. For example, system 600 can be configured with multiple memory devices 640 coupled in parallel, with each memory device responding to a command, and accessing memory resources 660 internal to each. For a Write operation, an individual memory device 640 can write a portion of the overall data word, and for a Read operation, an individual memory device 640 can fetch a portion of the overall data word. As non-limiting examples, a specific memory device can provide or receive, respectively, 8 bits of a 128-bit data word for a Read or Write transaction, or 8 bits or 16 bits (depending for a x8 or a x16 device) of a 256-bit data word. The remaining bits of the word will be provided or received by other memory devices in parallel.

In one example, memory devices 640 are disposed directly on a motherboard or host system platform (e.g., a PCB (printed circuit board) on which processor 610 is disposed) of a computing device. In one example, memory devices 640 can be organized into memory modules 670. In one example, memory modules 670 represent dual inline memory modules (DIMMs). In one example, memory modules 670 represent other organization of multiple memory devices to share at least a portion of access or control circuitry, which can be a separate circuit, a separate device, or a separate board from the host system platform. Memory modules 670 can include multiple memory devices 640, and the memory modules can include support for multiple separate channels to the included memory devices disposed on them. In another example, memory devices 640 may be incorporated into the same package as memory controller 620, such as by techniques such as multi-chip-module (MCM), package-on-package, through-silicon via (TSV), or other techniques or combinations. Similarly, in one example, multiple memory devices 640 may be incorporated into memory modules 670, which themselves may be incorporated into the same package as memory controller 620. It will be appreciated that for these and other implementations, memory controller 620 may be part of host processor 610.

Memory devices 640 each include memory resources 660. Memory resources 660 represent individual arrays of memory locations or storage locations for data. Typically memory resources 660 are managed as rows of data, accessed via wordline (rows) and bitline (individual bits within a row) control. Memory resources 660 can be organized as separate channels, ranks, and banks of memory. Channels may refer to independent control paths to storage locations within memory devices 640. Ranks may refer to common locations across multiple memory devices (e.g., same row addresses within different devices). Banks may refer to arrays of memory locations within a memory device 640. In one example, banks of memory are divided into sub-banks with at least a portion of shared circuitry (e.g., drivers, signal lines, control logic) for the sub-banks, allowing separate addressing and access. It will be understood that channels, ranks, banks, sub-banks, bank groups, or other organizations of the memory locations, and combinations of the organizations, can overlap in their application to physical resources. For example, the same physical memory locations can be accessed over a specific channel as a specific bank, which can also belong to a rank. Thus, the organization of memory resources will be understood in an inclusive, rather than exclusive, manner.

In one example, memory devices 640 include one or more registers 644. Register 644 represents one or more storage devices or storage locations that provide configuration or settings for the operation of the memory device. In one example, register 644 can provide a storage location for memory device 640 to store data for access by memory controller 620 as part of a control or management operation. In one example, register 644 includes one or more Mode Registers. In one example, register 644 includes one or more multipurpose registers. The configuration of locations within register 644 can configure memory device 640 to operate in different "modes," where command information can trigger different operations within memory device 640 based on the mode. Additionally or in the alternative, different modes can also trigger different operation from address information or other signal lines depending on the mode. Settings of register 644 can indicate configuration for I/O settings (e.g., timing, termination or ODT (on-die termination) 646, driver configuration, or other I/O settings).

In one example, memory device 640 includes ODT 646 as part of the interface hardware associated with I/O 642. ODT 646 can be configured as mentioned above, and provide settings for impedance to be applied to the interface to specified signal lines. In one example, ODT 646 is applied to DQ signal lines. In one example, ODT 646 is applied to command signal lines. In one example, ODT 646 is applied to address signal lines. In one example, ODT 646 can be applied to any combination of the preceding. The ODT settings can be changed based on whether a memory device is a selected target of an access operation or a non-target device. ODT 646 settings can affect the timing and reflections of signaling on the terminated lines. Careful control over ODT 646 can enable higher-speed operation with improved matching of applied impedance and loading. ODT 646 can be applied to specific signal lines of I/O interface 642, 622, and is not necessarily applied to all signal lines.

Memory device 640 includes controller 650, which represents control logic within the memory device to control internal operations within the memory device. For example, controller 650 decodes commands sent by memory controller 620 and generates internal operations to execute or satisfy the commands. Controller 650 can be referred to as an internal controller, and is separate from memory controller 620 of the host. Controller 650 can determine what mode is selected based on register 644, and configure the internal execution of operations for access to memory resources 660 or other operations based on the selected mode. Controller 650 generates control signals to control the routing of bits within memory device 640 to provide a proper interface for the selected mode and direct a command to the proper memory locations or addresses. Controller 650 includes command logic to decode command encoding received on command and address signal lines. Controller can identify commands and generate internal operations to execute requested commands.

Referring again to memory controller 620, memory controller 620 includes command logic to generate commands to send to memory devices 640. The generation of the commands can refer to the command prior to scheduling, or the preparation of queued commands ready to be sent. Generally, the signaling in memory subsystems includes address information within or accompanying the command to indicate or select one or more memory locations where the memory devices should execute the command. In response to scheduling of transactions for memory device 640, memory controller 620 can issue commands via I/O 622 to cause memory device 640 to execute the commands. In one example, controller 650 of memory device 640 receives and decodes command and address information received via I/O 642 from memory controller 620. Based on the received command and address information, controller 650 can control the timing of operations of the logic and circuitry within memory device 640 to execute the commands. Controller 650 is responsible for compliance with standards or specifications within memory device 640, such as timing and signaling requirements. Memory controller 620 can implement compliance with standards or specifications by access scheduling and control.

Memory controller 620 includes scheduler 630, which represents logic or circuitry to generate and order transactions to send to memory device 640. From one perspective, the primary function of memory controller 620 could be said to schedule memory access and other transactions to memory device 640. Such scheduling can include generating the transactions themselves to implement the requests for data by processor 610 and to maintain integrity of the data (e.g., such as with commands related to refresh). Transactions can include one or more commands, and result in the transfer of commands or data or both over one or multiple timing cycles such as clock cycles or unit intervals. Transactions can be for access such as read or write or related commands or a combination, and other transactions can include memory management commands for configuration, settings, data integrity, or other commands or a combination.

Memory controller 620 typically includes logic such as scheduler 630 to allow selection and ordering of transactions to improve performance of system 600. Thus, memory controller 620 can select which of the outstanding transactions should be sent to memory device 640 in which order, which is typically achieved with logic much more complex that a simple first-in first-out algorithm. Memory controller 620 manages the transmission of the transactions to memory device 640, and manages the timing associated with the transaction. In one example, transactions have deterministic timing, which can be managed by memory controller 620 and used in determining how to schedule the transactions with scheduler 630.

Figure 7:
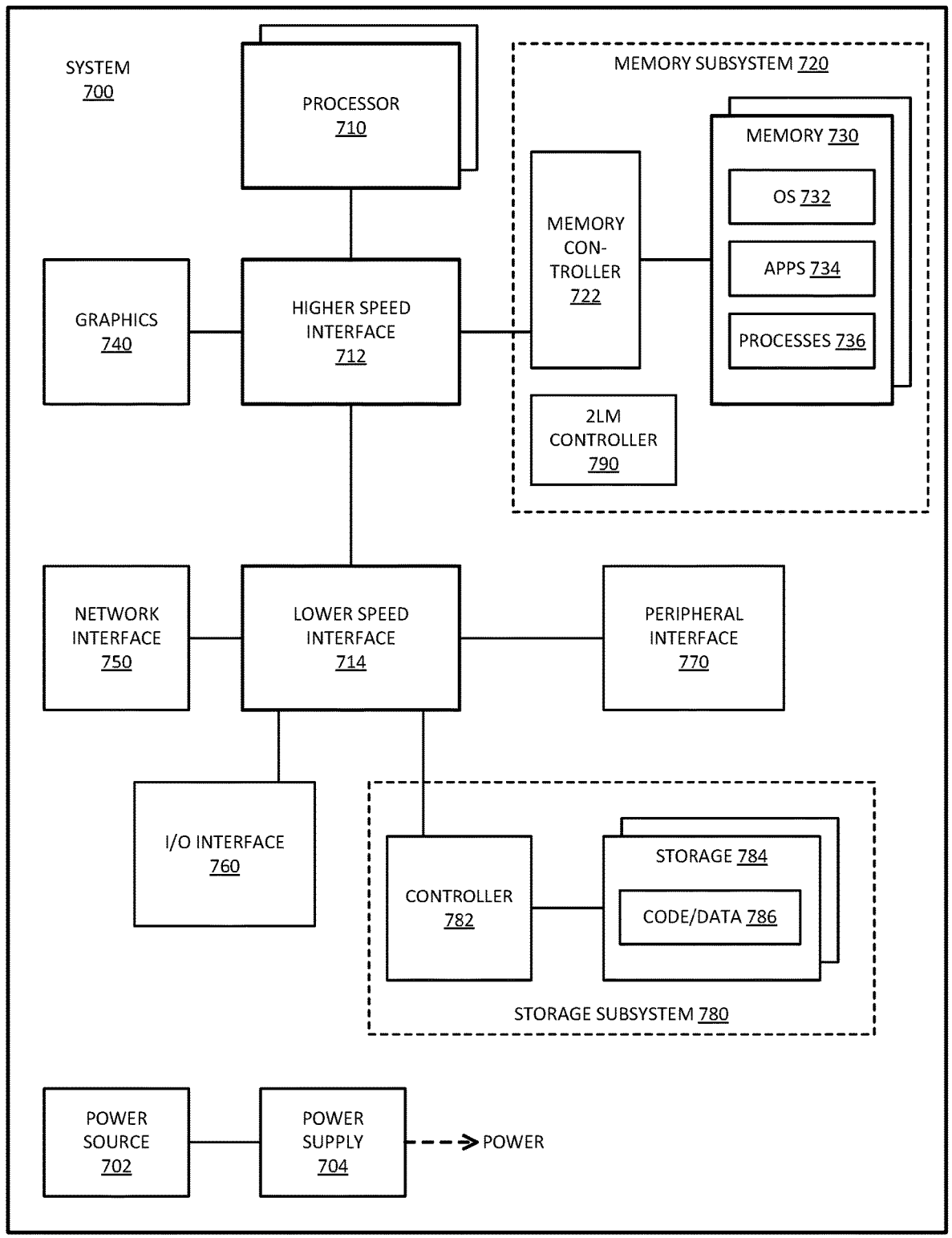
FIG. 7 is a block diagram of an example of a computing system in which a multilevel memory controller with embedded traffic routing can be implemented.

FIG. 7 is a block diagram of an example of a computing system in which a multilevel memory controller with embedded traffic routing can be implemented. System 700 represents a computing device in accordance with any example herein, and can be a laptop computer, a desktop computer, a tablet computer, a server, a gaming or entertainment control system, a scanner, copier, printer, routing or switching device, embedded computing device, a smartphone, a wearable device, an internet-of-things device or other electronic device.

In one example, system 700 includes 2LM controller 790 in memory subsystem 720. In such an example, memory subsystem 720 can be a 2LM system, with different memory types having different access times. The different memory subsystems have data pathways that can be tested with hardware embedded into 2LM controller 790. 2LM controller 790 can be a controller with embedded hardware in accordance with any example described herein. 2LM controller 790 can include hardware that selectively directs transactions to either near memory or far memory based on the test of data pathways, and can thus test near memory and far memory pathways.

System 700 includes processor 710, which provides processing, operation management, and execution of instructions for system 700. Processor 710 can include any type of microprocessor, central processing unit (CPU), graphics processing unit (GPU), processing core, or other processing hardware to provide processing for system 700, or a combination of processors. Processor 710 controls the overall operation of system 700, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

In one example, system 700 includes interface 712 coupled to processor 710, which can represent a higher speed interface or a high throughput interface for system components that needs higher bandwidth connections, such as memory subsystem 720 or graphics interface components 740. Interface 712 represents an interface circuit, which can be a standalone component or integrated onto a processor die. Where present, graphics interface 740 interfaces to graphics components for providing a visual display to a user of system 700. In one example, graphics interface 740 can drive a high definition (HD) display that provides an output to a user. High definition can refer to a display having a pixel density of approximately 100 PPI (pixels per inch) or greater, and can include formats such as full HD (e.g., 1080 p), retina displays, 4K (ultra high definition or UHD), or others. In one example, the display can include a touchscreen display. In one example, graphics interface 740 generates a display based on data stored in memory 730 or based on operations executed by processor 710 or both. In one example, graphics interface 740 generates a display based on data stored in memory 730 or based on operations executed by processor 710 or both.

Memory subsystem 720 represents the main memory of system 700, and provides storage for code to be executed by processor 710, or data values to be used in executing a routine. Memory subsystem 720 can include one or more memory devices 730 such as read-only memory (ROM), flash memory, one or more varieties of random access memory (RAM) such as DRAM, or other memory devices, or a combination of such devices. Memory 730 stores and hosts, among other things, operating system (OS) 732 to provide a software platform for execution of instructions in system 700. Additionally, applications 734 can execute on the software platform of OS 732 from memory 730. Applications 734 represent programs that have their own operational logic to perform execution of one or more functions. Processes 736 represent agents or routines that provide auxiliary functions to OS 732 or one or more applications 734 or a combination. OS 732, applications 734, and processes 736 provide software logic to provide functions for system 700. In one example, memory subsystem 720 includes memory controller 722, which is a memory controller to generate and issue commands to memory 730. It will be understood that memory controller 722 could be a physical part of processor 710 or a physical part of interface 712. For example, memory controller 722 can be an integrated memory controller, integrated onto a circuit with processor 710.

While not specifically illustrated, it will be understood that system 700 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus.

In one example, system 700 includes interface 714, which can be coupled to interface 712. Interface 714 can be a lower speed interface than interface 712. In one example, interface 714 represents an interface circuit, which can include standalone components and integrated circuitry. In one example, multiple user interface components or peripheral components, or both, couple to interface 714. Network interface 750 provides system 700 the ability to communicate with remote devices (e.g., servers or other computing devices) over one or more networks. Network interface 750 can include an Ethernet adapter, wireless interconnection components, cellular network interconnection components, USB (universal serial bus), or other wired or wireless standards-based or proprietary interfaces. Network interface 750 can exchange data with a remote device, which can include sending data stored in memory or receiving data to be stored in memory.

In one example, system 700 includes one or more input/output (I/O) interface(s) 760. I/O interface 760 can include one or more interface components through which a user interacts with system 700 (e.g., audio, alphanumeric, tactile/touch, or other interfacing). Peripheral interface 770 can include any hardware interface not specifically mentioned above. Peripherals refer generally to devices that connect dependently to system 700. A dependent connection is one where system 700 provides the software platform or hardware platform or both on which operation executes, and with which a user interacts.

In one example, system 700 includes storage subsystem 780 to store data in a nonvolatile manner. In one example, in certain system implementations, at least certain components of storage 780 can overlap with components of memory subsystem 720. Storage subsystem 780 includes storage device(s) 784, which can be or include any conventional medium for storing large amounts of data in a nonvolatile manner, such as one or more magnetic, solid state, or optical based disks, or a combination. Storage 784 holds code or instructions and data 786 in a persistent state (i.e., the value is retained despite interruption of power to system 700). Storage 784 can be generically considered to be a "memory," although memory 730 is typically the executing or operating memory to provide instructions to processor 710. Whereas storage 784 is nonvolatile, memory 730 can include volatile memory (i.e., the value or state of the data is indeterminate if power is interrupted to system 700). In one example, storage subsystem 780 includes controller 782 to interface with storage 784. In one example controller 782 is a physical part of interface 714 or processor 710, or can include circuits or logic in both processor 710 and interface 714.

Power source 702 provides power to the components of system 700. More specifically, power source 702 typically interfaces to one or multiple power supplies 704 in system 702 to provide power to the components of system 700. In one example, power supply 704 includes an AC to DC (alternating current to direct current) adapter to plug into a wall outlet. Such AC power can be renewable energy (e.g., solar power) power source 702. In one example, power source 702 includes a DC power source, such as an external AC to DC converter. In one example, power source 702 or power supply 704 includes wireless charging hardware to charge via proximity to a charging field. In one example, power source 702 can include an internal battery or fuel cell source.

Figure 8:
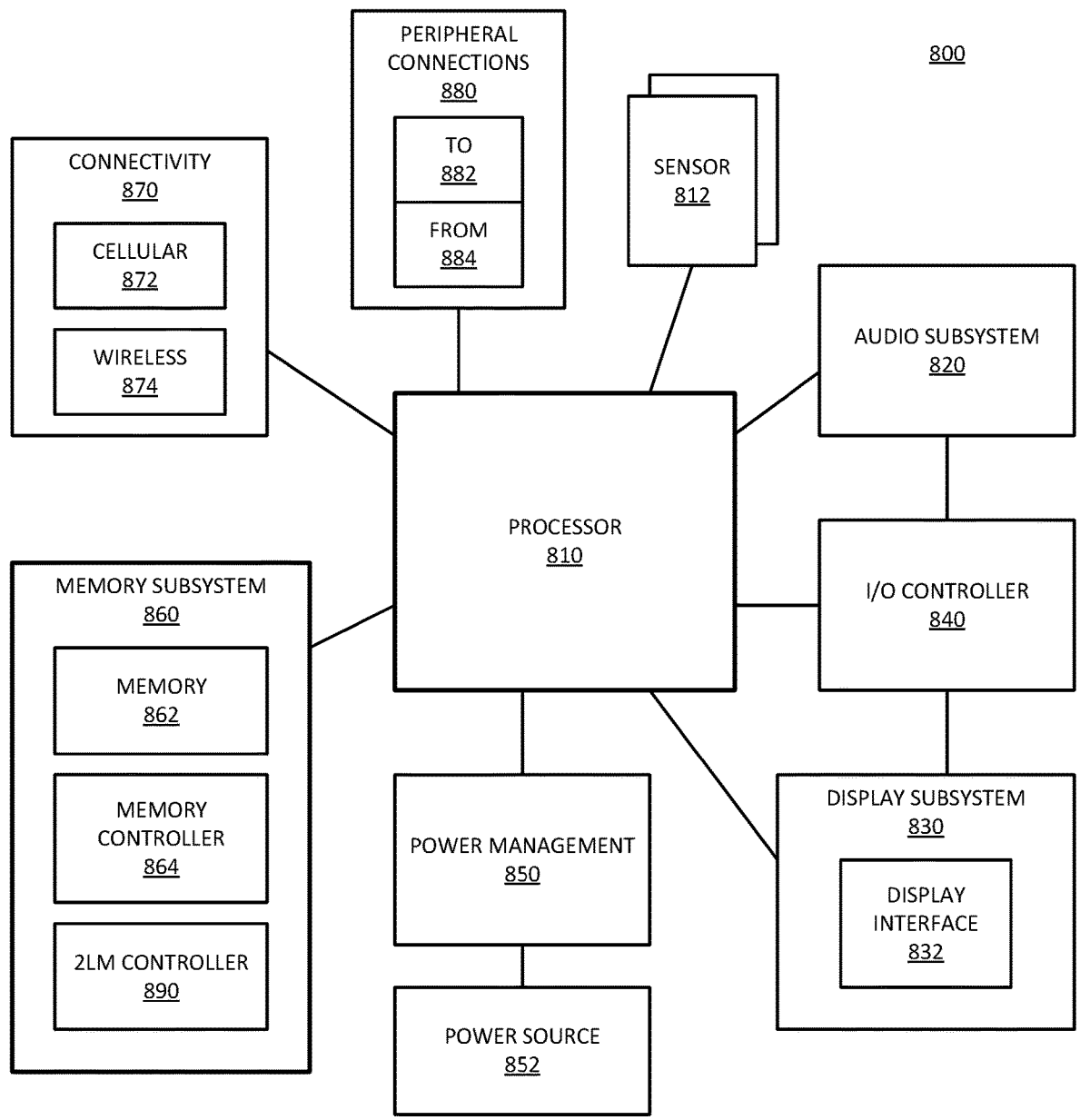
FIG. 8 is a block diagram of an example of a mobile device in which a multilevel memory controller with embedded traffic routing can be implemented.

FIG. 8 is a block diagram of an example of a mobile device in which a multilevel memory controller with embedded traffic routing can be implemented. Device 800 represents a mobile computing device, such as a computing tablet, a mobile phone or smartphone, a wireless-enabled e-reader, wearable computing device, an internet-of-things device or other mobile device, or an embedded computing device. It will be understood that certain of the components are shown generally, and not all components of such a device are shown in device 800.

In one example, system 800 includes 2LM controller 890 in memory subsystem 860. In such an example, memory subsystem 860 can be a 2LM system, with different memory types having different access times. The different memory subsystems have data pathways that can be tested with hardware embedded into 2LM controller 890. 2LM controller 890 can be a controller with embedded hardware in accordance with any example described herein. 2LM controller 890 can include hardware that selectively directs transactions to either near memory or far memory based on the test of data pathways, and can thus test near memory and far memory pathways.

Device 800 includes processor 810, which performs the primary processing operations of device 800. Processor 810 can include one or more physical devices, such as microprocessors, application processors, microcontrollers, programmable logic devices, or other processing means. The processing operations performed by processor 810 include the execution of an operating platform or operating system on which applications and device functions are executed. The processing operations include operations related to I/O (input/output) with a human user or with other devices, operations related to power management, operations related to connecting device 800 to another device, or a combination. The processing operations can also include operations related to audio I/O, display I/O, or other interfacing, or a combination. Processor 810 can execute data stored in memory. Processor 810 can write or edit data stored in memory.

In one example, system 800 includes one or more sensors 812. Sensors 812 represent embedded sensors or interfaces to external sensors, or a combination. Sensors 812 enable system 800 to monitor or detect one or more conditions of an environment or a device in which system 800 is implemented. Sensors 812 can include environmental sensors (such as temperature sensors, motion detectors, light detectors, cameras, chemical sensors (e.g., carbon monoxide, carbon dioxide, or other chemical sensors)), pressure sensors, accelerometers, gyroscopes, medical or physiology sensors (e.g., biosensors, heart rate monitors, or other sensors to detect physiological attributes), or other sensors, or a combination. Sensors 812 can also include sensors for biometric systems such as fingerprint recognition systems, face detection or recognition systems, or other systems that detect or recognize user features. Sensors 812 should be understood broadly, and not limiting on the many different types of sensors that could be implemented with system 800. In one example, one or more sensors 812 couples to processor 810 via a frontend circuit integrated with processor 810. In one example, one or more sensors 812 couples to processor 810 via another component of system 800.

In one example, device 800 includes audio subsystem 820, which represents hardware (e.g., audio hardware and audio circuits) and software (e.g., drivers, codecs) components associated with providing audio functions to the computing device. Audio functions can include speaker or headphone output, as well as microphone input. Devices for such functions can be integrated into device 800, or connected to device 800. In one example, a user interacts with device 800 by providing audio commands that are received and processed by processor 810.

Display subsystem 830 represents hardware (e.g., display devices) and software components (e.g., drivers) that provide a visual display for presentation to a user. In one example, the display includes tactile components or touchscreen elements for a user to interact with the computing device. Display subsystem 830 includes display interface 832, which includes the particular screen or hardware device used to provide a display to a user. In one example, display interface 832 includes logic separate from processor 810 (such as a graphics processor) to perform at least some processing related to the display. In one example, display subsystem 830 includes a touchscreen device that provides both output and input to a user. In one example, display subsystem 830 includes a high definition (HD) display that provides an output to a user. High definition can refer to a display having a pixel density of approximately 100 PPI (pixels per inch) or greater, and can include formats such as full HD (e.g., 1080 p), retina displays, 4K (ultra high definition or UHD), or others. In one example, display subsystem includes a touchscreen display. In one example, display subsystem 830 generates display information based on data stored in memory or based on operations executed by processor 810 or both.

I/O controller 840 represents hardware devices and software components related to interaction with a user. I/O controller 840 can operate to manage hardware that is part of audio subsystem 820, or display subsystem 830, or both. Additionally, I/O controller 840 illustrates a connection point for additional devices that connect to device 800 through which a user might interact with the system. For example, devices that can be attached to device 800 might include microphone devices, speaker or stereo systems, video systems or other display device, keyboard or keypad devices, or other I/O devices for use with specific applications such as card readers or other devices.

As mentioned above, I/O controller 840 can interact with audio subsystem 820 or display subsystem 830 or both. For example, input through a microphone or other audio device can provide input or commands for one or more applications or functions of device 800. Additionally, audio output can be provided instead of or in addition to display output. In another example, if display subsystem includes a touchscreen, the display device also acts as an input device, which can be at least partially managed by I/O controller 840. There can also be additional buttons or switches on device 800 to provide I/O functions managed by I/O controller 840.

In one example, I/O controller 840 manages devices such as accelerometers, cameras, light sensors or other environmental sensors, gyroscopes, global positioning system (GPS), or other hardware that can be included in device 800, or sensors 812. The input can be part of direct user interaction, as well as providing environmental input to the system to influence its operations (such as filtering for noise, adjusting displays for brightness detection, applying a flash for a camera, or other features).

In one example, device 800 includes power management 850 that manages battery power usage, charging of the battery, and features related to power saving operation. Power management 850 manages power from power source 852, which provides power to the components of system 800. In one example, power source 852 includes an AC to DC (alternating current to direct current) adapter to plug into a wall outlet. Such AC power can be renewable energy (e.g., solar power, motion based power). In one example, power source 852 includes only DC power, which can be provided by a DC power source, such as an external AC to DC converter. In one example, power source 852 includes wireless charging hardware to charge via proximity to a charging field. In one example, power source 852 can include an internal battery or fuel cell source.

Memory subsystem 860 includes memory device(s) 862 for storing information in device 800. Memory subsystem 860 can include nonvolatile (state does not change if power to the memory device is interrupted) or volatile (state is indeterminate if power to the memory device is interrupted) memory devices, or a combination. Memory 860 can store application data, user data, music, photos, documents, or other data, as well as system data (whether long-term or temporary) related to the execution of the applications and functions of system 800. In one example, memory subsystem 860 includes memory controller 864 (which could also be considered part of the control of system 800, and could potentially be considered part of processor 810). Memory controller 864 includes a scheduler to generate and issue commands to control access to memory device 862.

Connectivity 870 includes hardware devices (e.g., wireless or wired connectors and communication hardware, or a combination of wired and wireless hardware) and software components (e.g., drivers, protocol stacks) to enable device 800 to communicate with external devices. The external device could be separate devices, such as other computing devices, wireless access points or base stations, as well as peripherals such as headsets, printers, or other devices. In one example, system 800 exchanges data with an external device for storage in memory or for display on a display device. The exchanged data can include data to be stored in memory, or data already stored in memory, to read, write, or edit data.

Connectivity 870 can include multiple different types of connectivity. To generalize, device 800 is illustrated with cellular connectivity 872 and wireless connectivity 874. Cellular connectivity 872 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 874 refers to wireless connectivity that is not cellular, and can include personal area networks (such as Bluetooth), local area networks (such as WiFi), or wide area networks (such as WiMax), or other wireless communication, or a combination. Wireless communication refers to transfer of data through the use of modulated electromagnetic radiation through a non-solid medium. Wired communication occurs through a solid communication medium.

Peripheral connections 880 include hardware interfaces and connectors, as well as software components (e.g., drivers, protocol stacks) to make peripheral connections. It will be understood that device 800 could both be a peripheral device ("to" 882) to other computing devices, as well as have peripheral devices ("from" 884) connected to it. Device 800 commonly has a "docking" connector to connect to other computing devices for purposes such as managing (e.g., downloading, uploading, changing, synchronizing) content on device 800. Additionally, a docking connector can allow device 800 to connect to certain peripherals that allow device 800 to control content output, for example, to audiovisual or other systems.

In addition to a proprietary docking connector or other proprietary connection hardware, device 800 can make peripheral connections 880 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), or other type.

In general with respect to the descriptions herein, in one example a controller includes: a data pathway including signal lines to transfer a data request according to original tag information for the data request; routing hardware to selectively provide alternate tag information for the data request to cause a cache hit or a cache miss to selectively direct the request to a near memory device or to a far memory device separate from the near memory device, respectively; and selection circuitry to select between the original tag information and the alternate tag information.

In one example, the routing hardware is to provide alternate tag information to cause a request directed to data stored in the near memory device to be routed for processing by the far memory device. In one example, the routing hardware is to provide alternate tag information to cause a request directed to data not stored in the near memory device to be routed for processing by the near memory device. In one example, the routing hardware is to modify a field to select a different way than a way identified in the original tag information. In one example, the routing hardware is to modify a field to select a different channel than a channel identified in the original tag information. In one example, the routing hardware is to modify a field to select a different set than a set identified in the original tag information. In one example, the routing hardware is to modify a field to apply a set mask to select a different location than a location identified in the original tag information. In one example, the selection circuitry comprises a multiplexer. In one example, the multiplexer comprises a comparator array to compare selected tag information to original tag information and modified tag information. In one example, the selection circuitry is to select between the original tag information and the alternate tag information to direct the data request to a double data rate (DDR) controller to interface with dynamic random access memory (DRAM) near memory, or to direct the data request to a peripheral connection interface express (PCIe) controller to interface with byte addressable nonvolatile far memory.

In general with respect to the descriptions herein, in one example a system comprising: a volatile memory controller to interface with a volatile memory device having byte addressable memory locations; a nonvolatile memory controller to interface with a nonvolatile memory device having byte addressable memory locations; and a two-level memory (2LM) controller to receive a data request including original tag information, the 2LM controller including routing hardware to selectively provide alternate tag information for the data request to cause a cache hit or a cache miss to selectively direct the request to the volatile memory controller or to the nonvolatile memory controller, respectively, and select between the original tag information and the alternate tag information.

In one example, the 2LM controller is to provide alternate tag information to cause a request directed to data stored in the volatile memory device to be routed for processing by the nonvolatile memory controller. In one example, the 2LM controller is to provide alternate tag information to cause a request directed to data not stored in the volatile memory device to be routed for processing by the volatile memory controller. In one example, the 2LM controller is to modify a field to select a different way than a way identified in the original tag information. In one example, the 2LM controller is to modify a field to select a different channel than a channel identified in the original tag information. In one example, the 2LM controller is to modify a field to select a different set than a set identified in the original tag information. In one example, the 2LM controller is to modify a field to apply a set mask to select a different location than a location identified in the original tag information. In one example, the 2LM controller comprises a comparator array to compare selected tag information to original tag information and modified tag information. In one example, the 2LM controller is to select between the original tag information and the alternate tag information to direct the data request to a double data rate (DDR) controller to interface with dynamic random access memory (DRAM), or to direct the data request to a peripheral connection interface express (PCIe) controller to interface with byte addressable nonvolatile. In one example, the volatile memory controller further comprises logic to implement a virtual volatile memory device, to enable testing pathways within the system to the volatile memory device without sending a request to a physical volatile memory device. In one example, the nonvolatile memory controller further comprises logic to implement a virtual nonvolatile memory device, to enable testing pathways within the system to the nonvolatile memory device without sending a request to a physical nonvolatile memory device. In one example, further comprising one or more of: at least one processor communicatively coupled to the memory controller; a display communicatively coupled to at least one processor; a network interface communicatively coupled to at least one processor; or a battery to power the system.

In general with respect to the descriptions herein, in one example a method includes: transferring a data request according to original tag information for the data request; selectively providing alternate tag information for the data request to cause a cache hit or a cache miss to selectively direct the request to a near memory device or to a far memory device separate from the near memory device, respectively; and selecting between the original tag information and the alternate tag information.

In one example, providing alternate tag information comprises causing a request directed to data stored in the near memory device to be routed for processing by the far memory device. In one example, providing alternate tag information comprises causing a request directed to data not stored in the near memory device to be routed for processing by the near memory device. In one example, providing the alternate tag information comprises modifying a field to select a different way than a way identified in the original tag information. In one example, providing the alternate tag information comprises modifying a field to select a different channel than a channel identified in the original tag information. In one example, providing the alternate tag information comprises modifying a field to select a different set than a set identified in the original tag information. In one example, providing the alternate tag information comprises modifying a field to apply a set mask to select a different location than a location identified in the original tag information. In one example, selecting comprises multiplexing. In one example, multiplexing comprises comparing selected tag information to original tag information and modified tag information with a comparator array. In one example, selecting between the original tag information and the alternate tag information comprises directing the data request to a double data rate (DDR) controller to interface with dynamic random access memory (DRAM) near memory, or directing the data request to a peripheral connection interface express (PCIe) controller to interface with byte addressable nonvolatile far memory.

Flow diagrams as illustrated herein provide examples of sequences of various process actions. The flow diagrams can indicate operations to be executed by a software or firmware routine, as well as physical operations. A flow diagram can illustrate an example of the implementation of states of a finite state machine (FSM), which can be implemented in hardware and/or software. Although shown in a particular sequence or order, unless otherwise specified, the order of the actions can be modified. Thus, the illustrated diagrams should be understood only as examples, and the process can be performed in a different order, and some actions can be performed in parallel. Additionally, one or more actions can be omitted; thus, not all implementations will perform all actions.

To the extent various operations or functions are described herein, they can be described or defined as software code, instructions, configuration, and/or data. The content can be directly executable ("object" or "executable" form), source code, or difference code ("delta" or "patch" code). The software content of what is described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to what is disclosed and implementations of the invention without departing from their scope. Therefore, the illustrations and examples herein should be construed in an illustrative, and not a restrictive sense. The scope of the invention should be measured solely by reference to the claims that follow.

What is claimed is:

1. A controller device, comprising:
  a data pathway including signal lines to transfer a data request according to original tag information for the data request;
  routing hardware to selectively provide alternate tag information for the data request to cause a cache hit to selectively direct the data request to a near memory device or cause a cache miss to selectively direct the data request to a far memory device separate from the near memory device; and
  selection circuitry to select between the original tag information and the alternate tag information in response to the data request, to selectively cause a cache miss on the near memory device, whether or not data for the data request is stored in the near memory device.

2. The controller device of claim 1, wherein the routing hardware is to provide the alternate tag information to cause a request directed to data stored in the near memory device to be routed for processing by the far memory device.

3. The controller device of claim 1, wherein the routing hardware is to provide the alternate tag information to cause a request directed to data not stored in the near memory device to be routed for processing by the near memory device.

4. The controller device of claim 1, wherein the routing hardware is to modify a field to select a different way than a way identified in the original tag information.

5. The controller device of claim 1, wherein the routing hardware is to modify a field to select a different channel than a channel identified in the original tag information.

6. The controller device of claim 1, wherein the routing hardware is to modify a field to select a different set than a set identified in the original tag information.

7. The controller device of claim 1, wherein the routing hardware is to modify a field to apply a set mask to select a different location than a location identified in the original tag information.

8. The controller device of claim 1, wherein the selection circuitry comprises a multiplexer.

9. The controller device of claim 8, wherein the multiplexer comprises a comparator array to compare selected tag information to the original tag information and modified tag information.

10. The controller device of claim 1, wherein the selection circuitry is to select between the original tag information and the alternate tag information to direct the data request to a double data rate (DDR) controller to interface with dynamic random access memory (DRAM) near memory, or to direct the data request to a peripheral connection interface express (PCIe) controller to interface with byte addressable nonvolatile far memory.

11. A system comprising:
a volatile memory controller to interface with a volatile memory device having byte addressable memory locations;
a nonvolatile memory controller to interface with a nonvolatile memory device having byte addressable memory locations; and
a two-level memory (2LM) controller to receive a data request including original tag information, the 2LM controller including routing hardware to selectively provide alternate tag information for the data request to cause a cache hit to selectively direct the data request to a near memory device or cause a cache miss to selectively direct the data request to a far memory device separate from the near memory device, and select between the original tag information and the alternate tag information to selectively cause a cache miss on the near memory device, whether or not data for the data request is stored in the near memory device.

12. The system of claim 11, wherein the 2LM controller is to provide the alternate tag information to cause a request directed to data stored in the volatile memory device to be routed for processing by the nonvolatile memory controller.

13. The system of claim 11, wherein the 2LM controller is to provide the alternate tag information to cause a request directed to data not stored in the volatile memory device to be routed for processing by the volatile memory controller.

14. The system of claim 11, wherein the 2LM controller is to modify a field to select a different way than a way identified in the original tag information.

15. The system of claim 11, wherein the 2LM controller is to modify a field to select a different channel than a channel identified in the original tag information.

16. The system of claim 11, wherein the 2LM controller is to modify a field to select a different set than a set identified in the original tag information.

17. The system of claim 11, wherein the 2LM controller is to modify a field to apply a set mask to select a different location than a location identified in the original tag information.

18. The system of claim 11, wherein the 2LM controller comprises a comparator array to compare selected tag information to the original tag information and modified tag information.

19. The system of claim 11, wherein the 2LM controller is to select between the original tag information and the alternate tag information to direct the data request to a double data rate (DDR) controller to interface with dynamic random access memory (DRAM), or to direct the data request to a peripheral connection interface express (PCIe) controller to interface with byte addressable nonvolatile.

20. The system of claim 11, wherein the volatile memory controller further comprises logic to implement a virtual volatile memory device, to enable testing pathways within the system to the volatile memory device without sending a request to a physical volatile memory device.

21. The system of claim 11, wherein the nonvolatile memory controller further comprises logic to implement a virtual nonvolatile memory device, to enable testing pathways within the system to the nonvolatile memory device without sending a request to a physical nonvolatile memory device.

22. The system of claim 11, further comprising one or more of:
at least one processor communicatively coupled to the volatile memory controller;
a display communicatively coupled to at least one processor;
a network interface communicatively coupled to at least one processor; or
a battery to power the system.

* * * * *